(12) United States Patent
Shimura

(10) Patent No.: US 8,928,304 B2
(45) Date of Patent: Jan. 6, 2015

(54) SOLAR CELL SYSTEM WITH PREDICTIVE OUTPUT LOAD CONTROL

(71) Applicant: Sony Corporation, Tokyo (JP)

(72) Inventor: Jusuke Shimura, Kanagawa (JP)

(73) Assignee: Sony Corporation, Tokyo (JP)

(\*) Notice: Subject to any disclaimer, the term of this patent is extended or adjusted under 35 U.S.C. 154(b) by 243 days.

(21) Appl. No.: 13/659,944

(22) Filed: Oct. 25, 2012

(65) Prior Publication Data

US 2013/0106371 A1     May 2, 2013

(30) Foreign Application Priority Data

Nov. 1, 2011    (JP) ................................ 2011-240248

(51) Int. Cl.
     *G05F 5/00*         (2006.01)
     *H01L 31/02*       (2006.01)
     *H02J 7/35*         (2006.01)

(52) U.S. Cl.
     CPC .......... *H01L 31/02021* (2013.01); *Y02E 10/58* (2013.01); *H02J 7/35* (2013.01); *Y02E 10/542* (2013.01); *Y02E 10/566* (2013.01); *Y10S 323/906* (2013.01)
     USPC .......................................... 323/299; 323/906

(58) Field of Classification Search
     CPC ........... G05F 1/67; H02M 7/44; H02M 3/157; H02M 2001/007
     USPC ................. 323/222–225, 234–235, 266–268, 323/271–275, 282–285, 299–301, 906; 363/37–41, 79–81, 95–98, 131–132
     See application file for complete search history.

(56) References Cited

U.S. PATENT DOCUMENTS

| | | | | |
|---|---|---|---|---|
| 4,390,940 A | * | 6/1983 | Corbefin et al. | 363/132 |
| 5,682,305 A | * | 10/1997 | Kurokami et al. | 363/79 |
| 5,867,011 A | * | 2/1999 | Jo et al. | 323/299 |
| 5,892,354 A | * | 4/1999 | Nagao et al. | 323/299 |
| 5,923,100 A | * | 7/1999 | Lukens et al. | 307/66 |
| 5,923,158 A | * | 7/1999 | Kurokami et al. | 323/299 |

(Continued)

FOREIGN PATENT DOCUMENTS

| | | | |
|---|---|---|---|
| JP | 07-234733 | A | 9/1995 |
| JP | 08-076865 | A | 3/1996 |
| JP | 2002-048704 | A | 2/2002 |
| JP | 2004-280220 | A | 10/2004 |

OTHER PUBLICATIONS

Costa and Ribeiro; "Molecular dynamics simulation of polymer electrolytes based on poly(ethylene oxide) and ionic liquids. I. Structural properties"; J.Chem.Phys. 2006; 124: 184902-1-184902-8.

*Primary Examiner* — Timothy J Dole
*Assistant Examiner* — Yusef Ahmed
(74) *Attorney, Agent, or Firm* — Wolf, Greenfield & Sacks, P.C.

(57) ABSTRACT

Disclosed herein is a solar cell system including: a solar cell; a load controller connected to the solar cell, the load controller being capable of controlling a load applied to the solar cell; an output measuring unit for measuring a power generation output of the solar cell; and an output predicting unit for predicting a value to be reached by the output on a basis of transient response of the output measured by the output measuring unit, wherein the solar cell system has a function of controlling the load controller so as to maximize the value to be reached.

19 Claims, 22 Drawing Sheets

(56) References Cited

U.S. PATENT DOCUMENTS

| | | | |
|---|---|---|---|
| 6,046,919 A * | 4/2000 | Madenokouji et al. | 363/98 |
| 6,081,104 A * | 6/2000 | Kern | 323/268 |
| 6,111,767 A * | 8/2000 | Handleman | 363/95 |
| 6,339,538 B1 * | 1/2002 | Handleman | 363/95 |
| 6,493,246 B2 * | 12/2002 | Suzui et al. | 363/95 |
| 6,590,793 B1 * | 7/2003 | Nagao et al. | 363/95 |
| 6,801,442 B2 * | 10/2004 | Suzui et al. | 363/55 |
| 7,126,294 B2 * | 10/2006 | Minami et al. | 318/139 |
| 8,305,058 B2 * | 11/2012 | Kim et al. | 323/282 |
| 2001/0048605 A1 * | 12/2001 | Kurokami et al. | 363/56.03 |
| 2004/0264225 A1 * | 12/2004 | Bhavaraju et al. | 363/120 |
| 2008/0147335 A1 * | 6/2008 | Adest et al. | 702/64 |
| 2009/0289594 A1 * | 11/2009 | Sato | 320/101 |
| 2010/0157638 A1 * | 6/2010 | Naiknaware et al. | 363/131 |
| 2010/0208501 A1 * | 8/2010 | Matan et al. | 363/95 |
| 2010/0219690 A1 * | 9/2010 | Femia et al. | 307/77 |
| 2010/0246220 A1 * | 9/2010 | Irving et al. | 363/78 |
| 2010/0265747 A1 * | 10/2010 | Egiziano et al. | 363/132 |
| 2011/0293970 A1 * | 12/2011 | Shimura et al. | 429/7 |
| 2012/0069602 A1 * | 3/2012 | Escobar et al. | 363/13 |
| 2012/0153724 A1 * | 6/2012 | Hasegawa et al. | 307/31 |
| 2012/0206118 A1 * | 8/2012 | Williams | 323/282 |
| 2012/0296584 A1 * | 11/2012 | Itoh | 702/58 |
| 2013/0041511 A1 * | 2/2013 | Kohno et al. | 700/286 |
| 2013/0054037 A1 * | 2/2013 | Ikawa et al. | 700/286 |
| 2013/0181691 A1 * | 7/2013 | Fukada | 323/265 |
| 2013/0197834 A1 * | 8/2013 | Maki et al. | 702/60 |

* cited by examiner

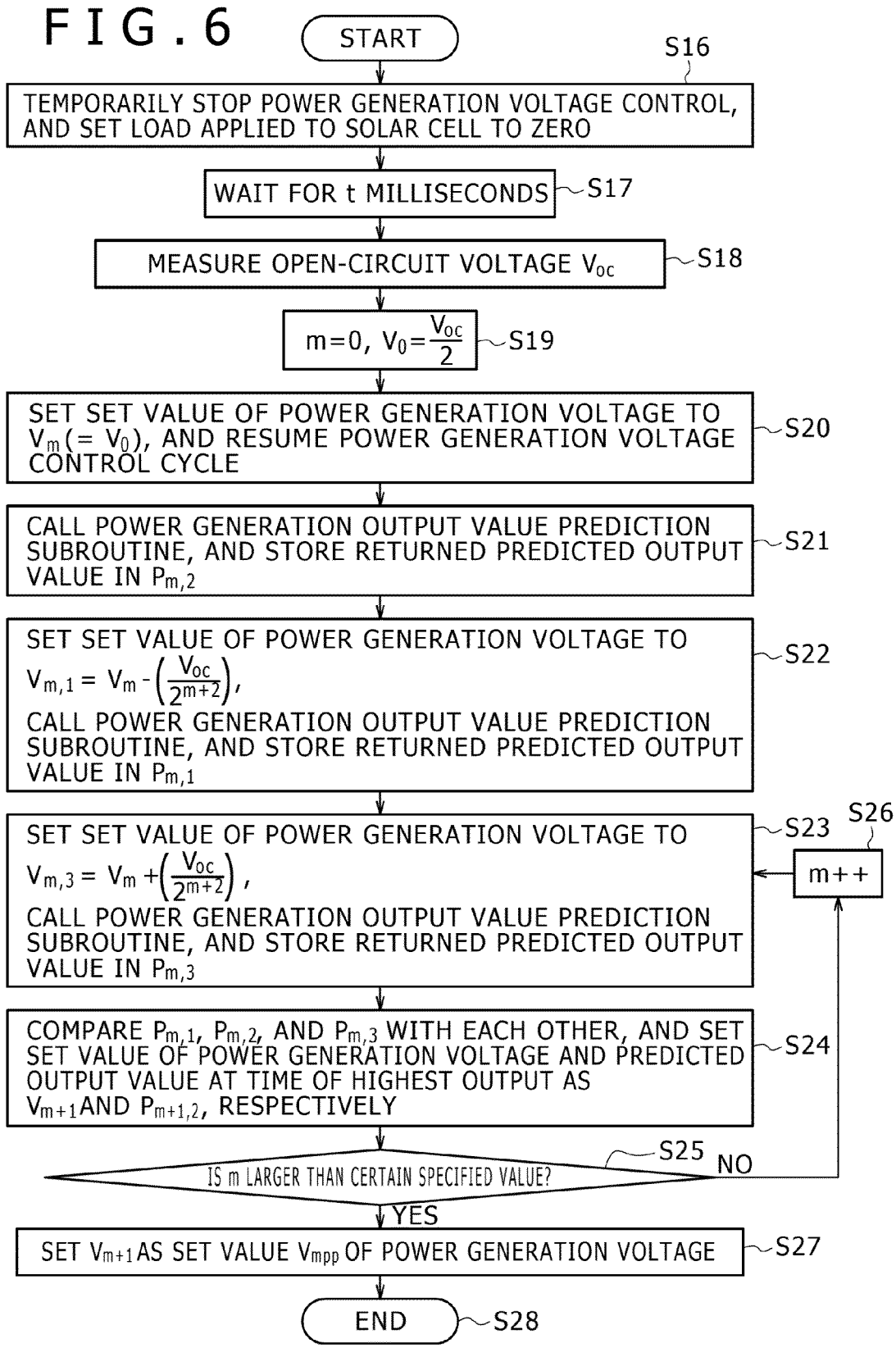

SOLAR CELL SYSTEM WITH PREDICTIVE OUTPUT LOAD CONTROL

CROSS REFERENCE TO RELATED APPLICATIONS

The present application claims priority under 35 U.S.C. §119 to Japanese Patent Application No. JP 2011-240248, filed in the Japan Patent Office on Nov. 1, 2011, then entire contents of which are incorporated herein by reference.

BACKGROUND

The present disclosure relates to a solar cell system, an electronic device, and a structure, and a solar cell system suitable for use with a dye-sensitized solar cell, for example, and an electronic device and a structure having the solar cell system.

Solar cells as photoelectric conversion elements for converting solar light into electric energy use solar light as an energy source. Solar cells therefore have a very small effect on a global environment, and are expected to spread further. Crystalline silicon based solar cells using single crystal silicon or polycrystalline silicon and amorphous silicon based solar cells have been mainly used as solar cells in the past.

On the other hand, a dye-sensitized solar cell proposed by Gratzel et al. in 1991 has been drawing attention because the dye-sensitized solar cell can provide high photoelectric conversion efficiency, and can be manufactured at low cost without a need for large-scale equipment at a time of the manufacturing unlike silicon based solar cells in the past (see Nature, 353, pp. 737-740, 1991, for example).

The dye-sensitized solar cell generally has a structure including porous electrodes made of titanium oxide ($TiO_2$) or the like to which a photosensitizing dye is bonded and an electrolytic layer of an electrolytic solution filled between these electrodes. An electrolytic solution obtained by dissolving an electrolyte including redox species such as iodine ($I_2$), iodide ions ($I^-$), and the like in a solvent is often used.

A solar cell has a current-voltage output characteristic (I-V output characteristic) such that the value of a current that can be extracted is determined by the value of voltage of a load connected to the solar cell. The power generation output P of the solar cell is expressed by a product of the power generation voltage V and the power generation current I of the solar cell. Thus, when the solar cell is in an open-circuit state, for example, the power generation current I does not flow, that is, I=0, so that the power generation output P is P=0. When the solar cell is in a short-circuit state, on the other hand, the value of the power generation current I becomes very large, but the power generation voltage V is V=0, so that, again, the power generation output P is P=0. That is, for efficient power generation of the solar cell, the load connected to the solar cell should not be a zero load as in the open-circuit state nor an overload as in the short-circuit state, and it is very important that the load be an appropriate load.

FIG. 21 is a diagram showing an example of the I-V output characteristic and the power-voltage output characteristic (P-V output characteristic) of the solar cell under a constant-light source.

As shown in FIG. 21, an axis of abscissas indicates the power generation voltage V occurring in the solar cell, and an axis of ordinates indicates the power generation current I of the solar cell and generated power output P. When attention is directed to the P-V output characteristic, an operating point that maximizes the output power from the solar cell is the vertex of the P-V output characteristic, and is generally referred to as a maximum power point (MPP). That is, it can be said that highest power generation efficiency is achieved when the solar cell is generating power at the MPP at all times.

However, the P-V output characteristic of the solar cell varies greatly depending on the intensity of solar radiation, temperature, load conditions, and the like, and the MPP correspondingly varies greatly. Thus, maximum power point tracking (MPPT) control is necessary to make the solar cell generate power with high efficiency at all times. Specifically, the MPPT control finds the MPP as a combination of the power generation voltage V and the power generation current I maximizing the power generation output P, continues applying an appropriate load to the solar cell so as to maintain that state at all times, and thereby makes the solar cell operate at a maximum efficiency at all times. In other words, the MPPT control is to convert solar energy into electric energy without a waste, and is in fact one of controls indispensable for driving the solar cell.

Electronic circuits used as MPPT control circuits are roughly classified into following two kinds of systems. One is a circuit that sets the power generation voltage as a control variable and performs feedback control so that the value of the power generation voltage is a set value. The other is a circuit that sets the power generation current as a control variable and performs feedback so that the value of the power generation current is a set value. These control methods are referred to as potential regulating control (Potentiostatic Control) and current regulating control (Galvanostatic Control), respectively, in a field of electrochemistry.

When an MPPT control circuit is actually designed, the former potential regulating control is used overwhelmingly. A reason for this is explained from the dependence of the power generation voltage and the power generation current on illuminance. The solar cell is generally desired to operate stably in a range of illuminance extending by a few orders of magnitude from an illuminance of about 0.5 $W/m^2$ within an office to an illuminance of about 1000 $W/m^2$ under direct sunlight in midsummer. By reason of the characteristics of the solar cell, the power generation current $I_{max}$ at the MPP is substantially proportional to illuminance. On the other hand, the power generation voltage $V_{max}$ at the MPP is substantially proportional to the logarithm of illuminance. That is, the power generation current varies sharply by a few orders of magnitude with changes in illuminance, whereas the power generation voltage is logarithmically compressed and thus varies in a reduced range. For this reason, the power generation voltage is easy to handle as a control variable, and a control circuit becomes simpler when controlling the power generation voltage.

A control method referred to as a hill climbing method has been known in the past among methods of the MPPT control. The hill climbing method changes the set value of the power generation voltage V or the power generation current I at certain time intervals by increasing or decreasing the set value of the power generation voltage V or the power generation current I, checks whether the power generation output P has been raised or dropped by the change, and determines whether to raise or lower the power generation voltage for a next time according to a result of the checking. An MPPT control method based on the hill climbing method is often used for power generation control on solar cells, and a large number of reports have heretofore been made on the technology (for example, Japanese Patent Laid-Open No. Hei 7-234733, Japanese Patent Laid-Open No. Hei 8-76865, Japanese Patent Laid-Open No. 2002-48704, and Japanese Patent Laid-Open No. 2004-280220).

SUMMARY

In a case where MPPT control is performed by the hill climbing method for power generation control on the solar cell, in order to detect the MPP with high accuracy, it suffices to increase resolution by narrowing a range of change in the set value of the power generation voltage V or the power generation current I. However, when the set value of either of the power generation voltage V and the power generation current I is changed in too narrow a range, it takes time to grasp the MPP. Then, power generation is not performed with a maximum efficiency during the time taken to grasp the MPP. A solar energy during that period therefore fails to be taken in and is wasted.

In addition, the MPPT control based on the hill climbing method involves a waiting time from the changing of the set value of the power generation voltage V or the power generation current I to next changing of the set value of the power generation voltage. The shorter the waiting time becomes, the more quickly the MPP can be grasped. For example, in a case of a solar cell with a fast electrical response speed, when the waiting time is a short time such as a few milliseconds to a few ten milliseconds, no problem is presented and the MPP can be grasped quickly. However, in a case of a solar cell with a slow electrical response speed, a waiting time in units of a few seconds is necessary. Then, it takes time to grasp the MPP, and also in this case, a solar energy similarly fails to be taken in as described above.

Thus, the MPPT control based on the hill climbing method is a good method in that a condition maximizing the power generation efficiency of the solar cell is found with high accuracy. However, when power generation control is performed on a solar cell with a slow electrical response speed by the MPPT control based on the hill climbing method, it takes time to grasp the MPP. This is because a waiting time in units of a few seconds occurs each time the set value of the power generation voltage V or the power generation current I is changed. It may therefore be impossible to perform the control while following changes in output characteristic of the solar cell due to changes in illuminance conditions or the like at an appropriate speed. When the MPP is to be found with high accuracy by increasing the resolution, in particular, the number of output measurements is increased, and thus the above-described waiting time is also increased, so that this problem becomes more serious.

On the other hand, control methods not depending on the electrical response speed include for example a voltage tracking method. The voltage tracking method sets a value obtained by multiplying an open-circuit voltage $V_{oc}$, which is a voltage when the solar cell is set in an open-circuit state, by a certain constant (whose typical value is 0.7 to 0.8) as the power generation voltage of the solar cell, and performs the potential regulating control. When this method is applied, the operating point of the solar cell continues remaining in the vicinity of the MPP, and stable power generation at about 80% of real capacity or higher can be performed.

Thus, the voltage tracking method is a control method independent of the electrical response speed of the solar cell, and can therefore be said to be more effective than the hill climbing method in a solar cell with a slow electrical response speed, in particular. However, this method does not grasp the MPP itself in the first place, and is therefore unable to make the solar cell generate power with a maximum efficiency at all times.

It is accordingly desirable to provide a novel solar cell system with low power consumption and at low cost which system can perform more rapid control than in the past to follow changes in the output characteristic of the solar cell and can make the solar cell generate power with a maximum efficiency at all times irrespective of the electrical response speed of the solar cell.

It is also desirable to provide a high-performance electronic device in which the excellent solar cell system as described above is used for a solar cell.

It is further desirable to provide a structure in which the excellent solar cell system as described above is used for a solar cell.

According to an embodiment of the present disclosure, there is provided a solar cell system including: a solar cell; a load controller connected to the solar cell, the load controller being capable of controlling a load applied to the solar cell; an output measuring unit for measuring a power generation output of the solar cell; and an output predicting unit for predicting a value to be reached by the output on a basis of transient response of the output measured by the output measuring unit, wherein the solar cell system has a function of controlling the load controller so as to maximize the value to be reached.

According to another embodiment of the present disclosure, there is provided an electronic device including: a solar cell system, wherein the solar cell system includes a solar cell, a load controller connected to the solar cell, the load controller being capable of controlling a load applied to the solar cell, an output measuring unit for measuring a power generation output of the solar cell, and an output predicting unit for predicting a value to be reached by the output on a basis of transient response of the output measured by the output measuring unit, and the solar cell system has a function of controlling the load controller so as to maximize the value to be reached.

According to another embodiment of the present disclosure, there is provided a structure including: a solar cell system, wherein the solar cell system includes a solar cell, a load controller connected to the solar cell, the load controller being capable of controlling a load applied to the solar cell, an output measuring unit for measuring a power generation output of the solar cell, and an output predicting unit for predicting a value to be reached by the output on a basis of transient response of the output measured by the output measuring unit, and the solar cell system has a function of controlling the load controller so as to maximize the value to be reached.

In the present disclosure, an n-division search method divides a certain range into n parts, and detects a desired point by narrowing the width of the division. As a concrete processing method, for example, a load range from a minimum load condition to a maximum load condition of the load controller is divided into n parts, and output prediction is performed under each of n load conditions in the output predicting unit. Next, a process of outputting the load condition providing a largest output value from n predicted output values obtained is performed. Next, a load range including the output load condition is divided into n parts, and output prediction is performed under each of n load conditions. Next, a process of outputting the load condition providing a largest output value from n predicted output values obtained is performed. This process is repeated while gradually narrowing a width of the load range including the output load condition, whereby an MPP is detected. However, the processing method of the n-division search method is not limited to these methods. In addition, the n-division search method may require n to be a natural number of three or more. Specifically, the n-division search method includes for example a three-division search method where n=3 and a four-division search method where n=4. In the three-division search method, in particular, a golden ratio is suitably used for division. However, the n-division search method is not limited to these methods, and n may be a natural number of five or more.

The solar cell may be basically any element as long as the element converts light energy into electric energy. Specifically, the solar cell includes silicon based solar cells, dye-sensitized solar cells, organic thin-film solar cells, and the like. However, the solar cell is not limited to these solar cells.

The solar cell and the solar cell system can be used for almost all things that need power, and may have any size. However, for example, the solar cell and the solar cell system can be used for electronic devices, structures, mobile objects, construction machines, industrial machines, agricultural machines, machine tools, power generation systems, power units, and the like. The power, size, shape, and the like of the solar cell and the solar cell system are determined according to a use or the like.

The electronic devices may be basically any devices, and include both portable type devices and stationary type devices. Specifically, the electronic devices are portable telephones, mobile devices, robots, personal computers, antennas, vehicle-mounted devices, clocks, various kinds of household electric appliances, and the like.

The structure is typically a large structure such as a building, particularly a commercial building, a condominium, or the like. However, the structure is not limited to these structures. The structure may be basically any structure as long as the structure is constructed with an external wall. Specifically, for example, the structure includes detached houses, apartment houses, station buildings, school buildings, government office buildings, promenades, stadiums, ballparks, hospitals, churches, factories, warehouses, cabins, garages, bridges, fixed playground equipment, and the like. It is particularly preferable that the structure be constructed with at least one window part (for example a glass window) or a natural lighting part. In addition, the structure may have a movable part. Specifically, for example, the structure includes movable bridges, astronomical observatories, Ferris wheels, parabolic antennas, signs having a movable part, and the like. However, the structure is not limited to the examples cited above.

Of photoelectric conversion elements and/or photoelectric conversion element modules electrically connected with a plurality of photoelectric conversion elements provided in the structure, photoelectric conversion elements and/or photoelectric conversion element modules electrically connected with a plurality of photoelectric conversion elements disposed in a window part, a natural lighting part, or the like are preferably formed so as to be sandwiched between two transparent plates and fixed as required. Photoelectric conversion elements and/or photoelectric conversion element modules are typically formed so as to be included between two glass plates and fixed as required.

The mobile objects may be basically any mobile objects. Specifically, the mobile objects includes automobiles, trucks, buses, two-wheeled vehicles, tricycles, elevators, sleighs, shopping carts, railroad vehicles, cable cars, ropeway carriers, monorail cars, linear motor cars, ships, hovercraft, aircraft, helicopters, gliders, balloons, airships, rockets, artificial satellites, spacecraft, space stations, and the like. The construction machines may be basically any construction machines. Specifically, the construction machines include shovels, bulldozers, crane trucks, road rollers, excavators, and the like. The agricultural machines may be basically any agricultural machines. Specifically, the agricultural machines include cultivators, tractors, combines, rice planting machines, and the like. However, the mobile objects are not limited to those cited above.

The present technology can provide a solar cell system having a power generation control system that consumes a smaller amount of power and can be formed at lower cost than power generation control systems in the past, which operates at higher speed than in the past, and which can make the solar cell generate power with a maximum efficiency at all times irrespective of the electrical response speed of the solar cell. A high-performance electronic device and the like can be realized by using this excellent solar cell system.

BRIEF DESCRIPTION OF THE DRAWINGS

FIG. 6 is a flowchart of a process of searching for an MPP by a four-division search method and setting the value of a power generation voltage;

DETAILED DESCRIPTION OF THE PREFERRED EMBODIMENTS

Recently, solar cells have commonly been included as driving power supplies in portable devices such as portable telephones, calculators, wristwatches, and the like, and a large number of solar cells have been commercialized. Among the solar cells, dye-sensitized solar cells have been in particularly increasing demand as driving power supplies to be included in portable devices and the like because the dye-sensitized solar cell can generate power with indoor lighting and can be produced at low cost, for example.

The power generation output characteristic of a solar cell included in a portable device changes rapidly as the portable device is used. A reason for this is that the energy source of the solar cell is solar light, and as the position or attitude of the portable device is changed when used by a user, for example, the position, the angle, or the like of a light incidence surface of the solar cell changes, and thus an illuminance condition changes rapidly. In addition, when the solar cell is installed in a structure or the like, the power generation output characteristic of the solar cell is not always constant because an amount of solar light and an angle of incidence of the solar light change according to time, season, weather, and the like. It is thus particularly important to quickly grasp an MPP varying according to variation in the power generation output by MPPT control when making the solar cell included in the portable device or the like generate power efficiently.

Figure 22A:
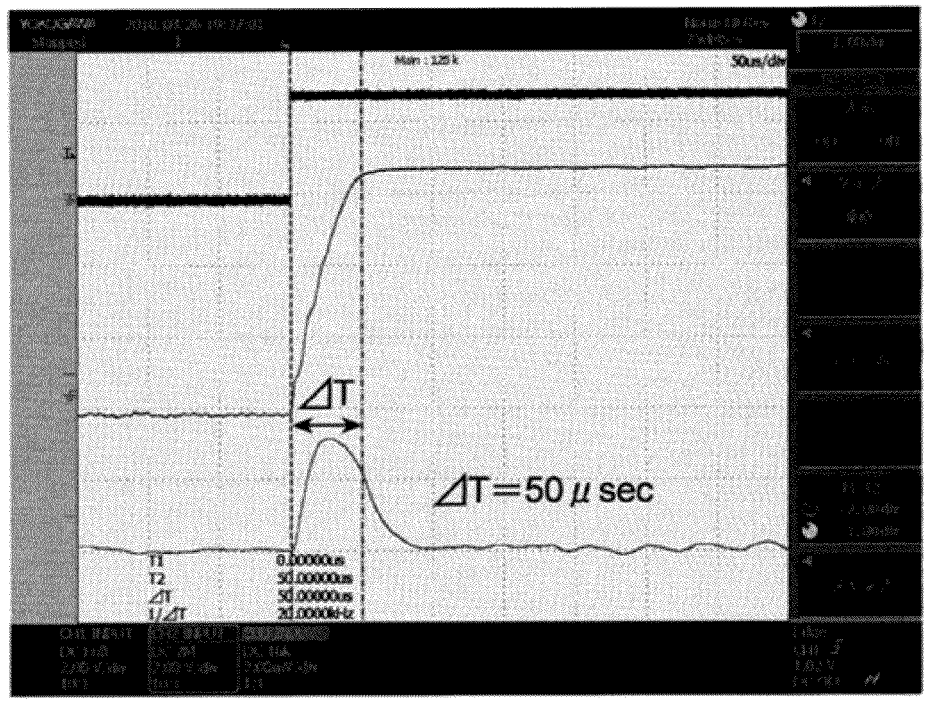
FIGS. 22A and 22B are photographs substituted for drawings, the photographs showing results of measurement of the electrical response characteristics of solar cells.
Figure 22B:
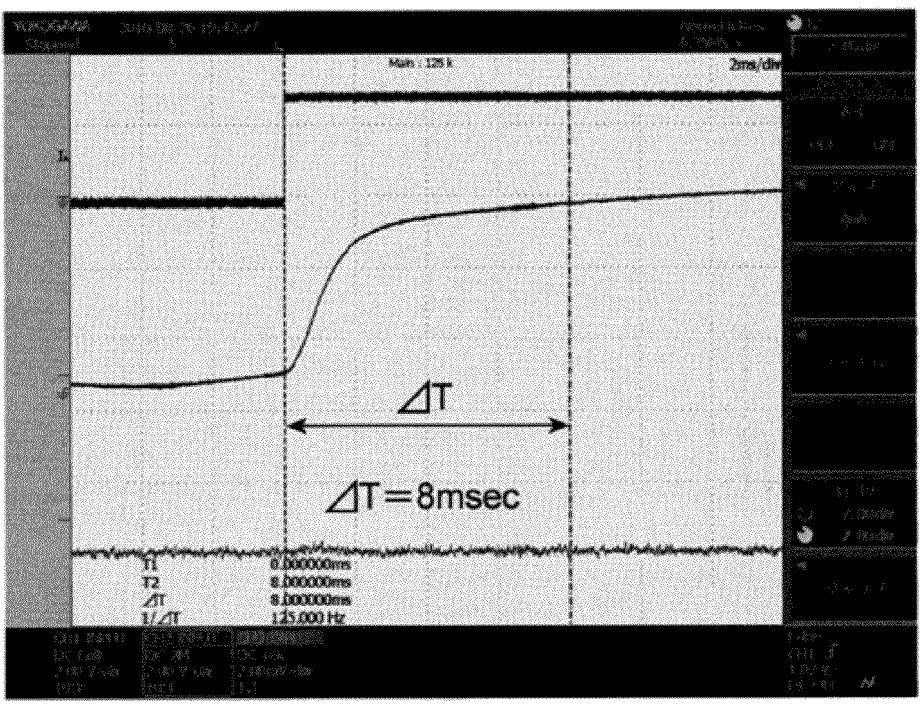

FIGS. 22A and 22B are photographs showing results of measurement of the electrical response characteristics of solar cells. FIG. 22A shows a result of measurement on a silicon based solar cell. FIG. 22B shows a result of measurement of step response of a dye-sensitized solar cell.

FIGS. 22A and 22B show that the electrical response speed of the dye-sensitized solar cell is by far slower than the electrical response speed of the silicon based solar cell, that is, $1/160$ of the electrical response speed of the silicon based solar cell. A reason for this is that charge carriers are iodide ions ($I^-$) and triiodide ions ($I_3^-$) dissolved in an electrolytic solution forming an electrolytic layer of the dye-sensitized solar cell. The dye-sensitized solar cell includes a porous electrode, a counter electrode, and the electrolytic layer disposed between the porous electrode and the counter electrode. The dye-sensitized solar cell operates as a cell having the counter electrode as a positive electrode and having a transparent electrode to which the porous electrode is provided or the like as a negative electrode. The iodide ions and the triiodide ions are included in the electrolytic solution in the electrolytic layer and the like. The iodide ions and the triiodide ions move violently during the charging of the dye-sensitized solar cell. Further, the ions are wrapped with surrounding solvent molecules to stabilize the ions themselves, thus forming large clusters. This is a phenomenon referred to as solvation. When the large clusters formed by such solvation push through the liquid, a great inertia occurs in the liquid. This causes a large transient response in the electrical characteristic of the solar cell as viewed as a whole.

Thus, the dye-sensitized solar cell has a large electrical transient response characteristic, and therefore has a very slow electrical response speed. As described above, this slow electrical response speed represents a long waiting time when power generation control is performed by MPPT control based on a hill climbing method in the past, and greatly decreases power generation efficiency. On the other hand, there is also a method of performing power generation control on the dye-sensitized solar cell by a voltage tracking method or the like whose control speed is not dependent on the electrical response speed of the element. However, as described above, the method does not achieve power generation at a maximum efficiency, and has a fixed operating point, so that MPP variations are not followed.

Thus, even in the case of the dye-sensitized solar cell having a slow electrical response speed, MPPT control that grasps MPP variations at all times may be essential in order to perform power generation control at a maximum efficiency at all times. However, when power generation control of the dye-sensitized solar cell is performed by MPPT control, power generation at a maximum efficiency cannot be achieved unless the problem of a decrease in power generation efficiency due to a slow electrical response speed as described above is solved.

Further, power consumed by a circuit for controlling the power generation of the solar cell is supplied from the power generated by the solar cell in many cases. Thus, when the circuit consumes a large amount of power, an amount of power generated as viewed as a whole is decreased. That is, it is very important to provide a control method and a controller that are realized satisfactorily even when control is performed by a controlling microcomputer that consumes a small amount of power and has a low processing power.

The present disclosers have carried out research earnestly in order to solve the above problems. First, an attempt was made to reduce the effects of the electrical response speed of the element by making the set value of a power generation voltage V in the hill climbing method change relatively greatly and reducing the number of searches. Then, the speed is increased due to the reduced number of searches, but then again an MPP cannot be grasped with high accuracy. In the hill climbing method, detection speed is sacrificed when MPP detection accuracy is increased, and the detection accuracy is sacrificed when the MPP detection speed is increased. It may therefore be necessary to use another control method or combine another control method with the hill climbing method.

Accordingly, the present disclosers have further proceeded with the research, and used a new n-division search method for MPPT control as a method for grasping an MPP accurately with a smaller number of searches than in the hill climbing method. The present disclosers have also directed attention to the electrical transient response characteristic of the dye-sensitized solar cell, and discovered that a steady-state value (that is, a value to be reached) is predicted without a wait for a steady state to be reached, by measuring the transient response of power generation output which transient response is caused by a change in the set value of the power generation voltage. The discovery led to the devising of the present technology.

A mode for carrying out the present technology (which mode will hereinafter be referred to as "embodiments") will be described in the following. Description will be made in the following order.
1. First Embodiment (Dye-Sensitized Solar Cell System and Operation of Dye-Sensitized Solar Cell System)
2. Second Embodiment (Solar Cell System and Operation of Solar Cell System)
3. Third Embodiment (Solar Cell System and Operation of Solar Cell System)
4. Fourth Embodiment (Solar Cell System and Operation of Solar Cell System)
5. Fifth Embodiment (Solar Cell System)

1. First Embodiment

[Solar Cell System]

Figure 1:
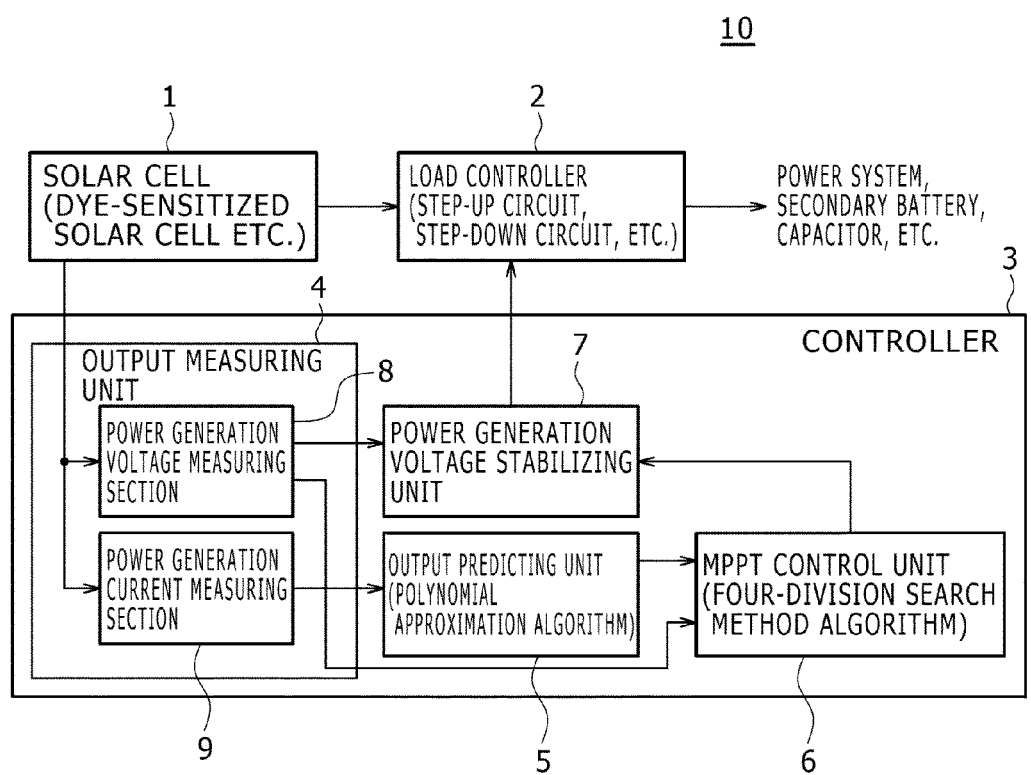
FIG. 1 is a block diagram showing a solar cell system according to a first embodiment.

FIG. 1 is a block diagram showing a solar cell system according to a first embodiment.

As shown in FIG. 1, the solar cell system 10 according to the first embodiment supplies power from a solar cell 1 to a power system, a secondary battery, a capacitor, or the like on the outside via a load controller 2. The load controller 2 is an adjustable load device such as a step-up circuit, a step-down circuit, or the like. The load controller 2 is controlled by a controller 3. The controller 3 includes an output measuring unit 4, an output predicting unit 5, an MPPT control unit 6, and a power generation voltage stabilizing unit 7. The output measuring unit 4 includes a power generation voltage measuring section 8 and a power generation current measuring section 9. The operation of the controller 3 includes measuring the output value of the solar cell 1 in the output measuring unit 4, thereafter determining a set value for the power generation voltage of the solar cell from the measured output value in the MPPT control unit 6, and performing feedback control in the power generation voltage stabilizing unit 7 so that the power generation voltage of the solar cell coincides with the set value. The solar cell is set in a constant-voltage power generation state as a result of the above operation performed by the controller 3.

The output measuring unit 4 includes the power generation voltage measuring section 8 and the power generation current measuring section 9. A power generation output is calculated by multiplying together the power generation voltage measured in the power generation voltage measuring section 8 and the power generation current measured in the power generation current measuring section 9. The power generation voltage measuring section 8 is specifically formed by a combination of a resistance type potential divider connected in parallel with the solar cell and an AD (analog-digital) converter or a combination of an amplifying circuit and an AD converter, for example. However, the power generation voltage measuring section 8 is not limited to these configurations. The power generation current measuring section 9 is specifically formed by a combination of a shunt resistance of a few ten mΩ to a few Ω connected in series with the low side or the high side of the solar cell, an amplifying circuit, and an AD converter, for example. In a case of a particularly large current, the power generation current measuring section 9 can be formed by a combination of a current probe using a transformer or a current probe using a magnetooptic effect, an amplifying circuit, and an AD converter. However, the power generation current measuring section 9 is not limited to these configurations.

The controller 3 can be a controlling microcomputer or the like. In this case, the output measuring unit 4 is an output measuring unit, the output predicting unit 5 is an output predicting unit, the MPPT control unit 6 is an MPPT control unit, the power generation voltage stabilizing unit 7 is a power generation voltage stabilizing unit, the power generation voltage measuring section 8 is a power generation voltage measuring section, and the power generation current measuring section 9 is a power generation current measuring section. In addition, the load controller 2 can be a control circuit, a microcomputer, or the like. In this case, the load controller 2 is a load controller.

[Operation of Solar Cell System]

Figure 2:
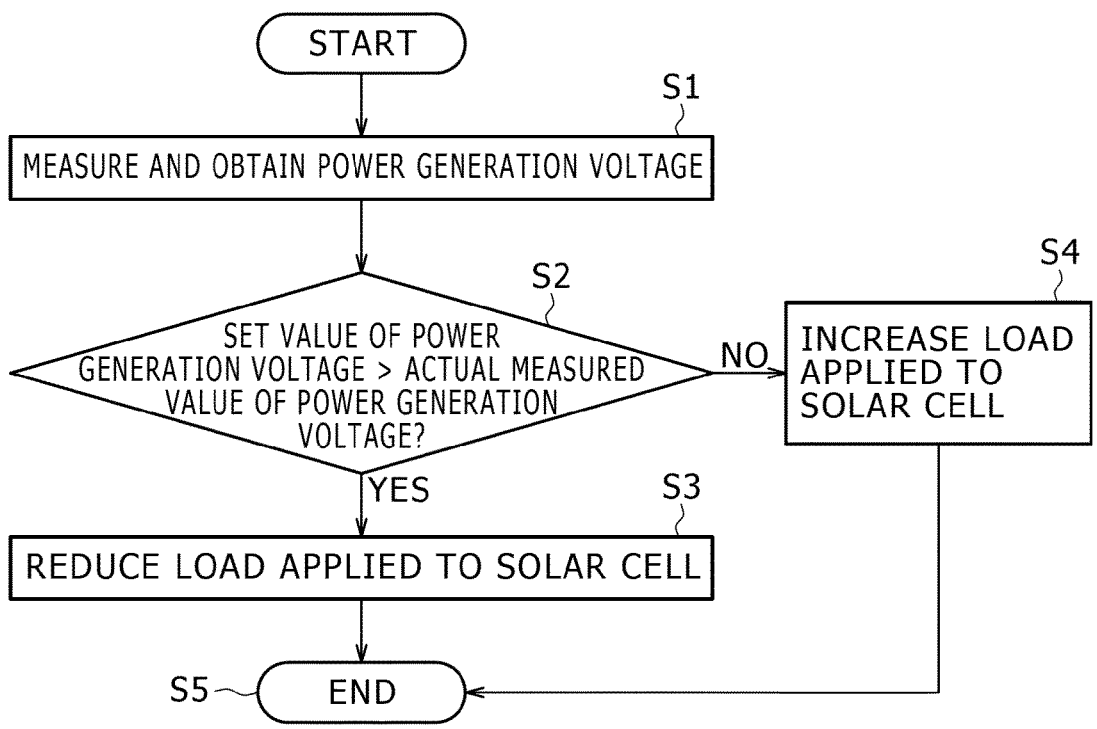
FIG. 2 is a flowchart of a flow of power generation voltage control for setting a solar cell in a constant-voltage power generation state.

FIG. 2 is a flowchart of a flow of power generation voltage control for setting the solar cell in a constant-voltage power generation state.

As shown in FIG. 2, this power generation voltage control algorithm measures the power generation voltage at certain intervals, and corrects an error between the measured voltage and the set value of the power generation voltage so that power generation is performed at a constant voltage at all times.

This power generation voltage control algorithm will be described in detail with reference to FIG. 2.

First, the power generation voltage measuring section 8 measures the power generation voltage (step S1).

Next, in step S2, when the value of the power generation voltage measured in step S1 is smaller than the set value of the power generation voltage which value is set in advance, a load set by the load controller 2 is decreased (step S3). When the value of the power generation voltage measured in step S1 is larger than the set value of the power generation voltage, on the other hand, the load set by the load controller 2 is increased (step S4). As a result of this control, feedback control is performed so that the power generation voltage of the solar cell and the set value of the power generation voltage coincide with each other, and the solar cell is controlled to be in a constant-voltage power generation state. The process is then ended (step S5).

The constant-voltage power generation state is achieved by periodically performing the power generation voltage control algorithm according to a timer function of the controller 3. Incidentally, when the electrical response speed is slow due to a large electrical transient response of the solar cell, and a hunting phenomenon is caused by the power generation voltage control algorithm, a difference between the set value of the power generation voltage and the actual measured value is calculated, and the power generation voltage is controlled by PID control.

In the present circuit, setting the value of the power generation voltage and adjusting the load are essentially equivalent to each other. Applying the load such that the power generation voltage is substantially 0 V means that a very heavy load is applied to the solar cell. Making the power generation voltage substantially equal to an open-circuit voltage means that substantially no load is applied to the solar cell.

The set value of the power generation voltage needs to be changed as appropriate for reasons of variations in output characteristic of the solar cell and the like. When the set value of the power generation voltage is changed, as described above, depending on the electrical transient response characteristic of the solar cell, it takes time for the output value to reach the value to be reached, and an increase in waiting time causes a decrease in power generation efficiency.

Accordingly, when the set value of the power generation voltage is changed in power generation control on the solar cell, the output value is predicted by the output predicting unit 5, the obtained predicted output value is regarded as the power generation output value of the solar cell, and the power generation control is performed in the MPPT control unit 6.

The output predicting unit 5 measures the transient response of the power generation output which transient response is caused by a change in the set value of the power generation voltage, and predicts the value to be reached without waiting for the power generation output to reach a steady state. Typically, the output predicting unit 5 is set to be called each time the set value of the power generation voltage is updated. However, the output predicting unit 5 is not limited to this method. The output predicting unit 5 may also be set to be called at certain intervals.

The transient response of the power generation output after a change in the set value of the power generation voltage can often be expressed by an equation of an exponential function as in Equation (1), for example.

$$P_n = -a\exp\left(\frac{-n}{b}\right) + P_{final} \tag{1}$$

In Equation (1), $P_n$ is an output value actually measured by measurement for an nth loop time, and $P_{final}$ is the value to be reached by the output. In addition, a and b are each an arbitrary constant. The constant a increases as the set value of the power generation voltage is changed greatly. The constant b is in positive correlation with the slowness of the electrical response speed.

The constant b in the output characteristic of the dye-sensitized solar cell, in particular, among solar cells is by far larger than the constant b in the silicon based solar cell. In addition, the constant b in the output characteristic of the dye-sensitized solar cell tends to become larger according to secular degradation.

When the value to be reached by the power generation output is a predicted output value, for example, the predicted output value can be obtained by performing measurement three times in the output measuring unit 4, substituting a set of the number of loop times n and the actual measured output value $P_n$ into Equation (1), and solving simultaneous equations including exp. However, the predicted output value can be obtained more easily by approximating the value $P_{final}$ to be reached by the output. Specifically, the value $P_{final}$ to be reached by the output can be approximated by performing processing with only a combination of four arithmetic operations using at least four actual measured values measured by the output measuring unit 4 and at least three constants.

Figure 3:
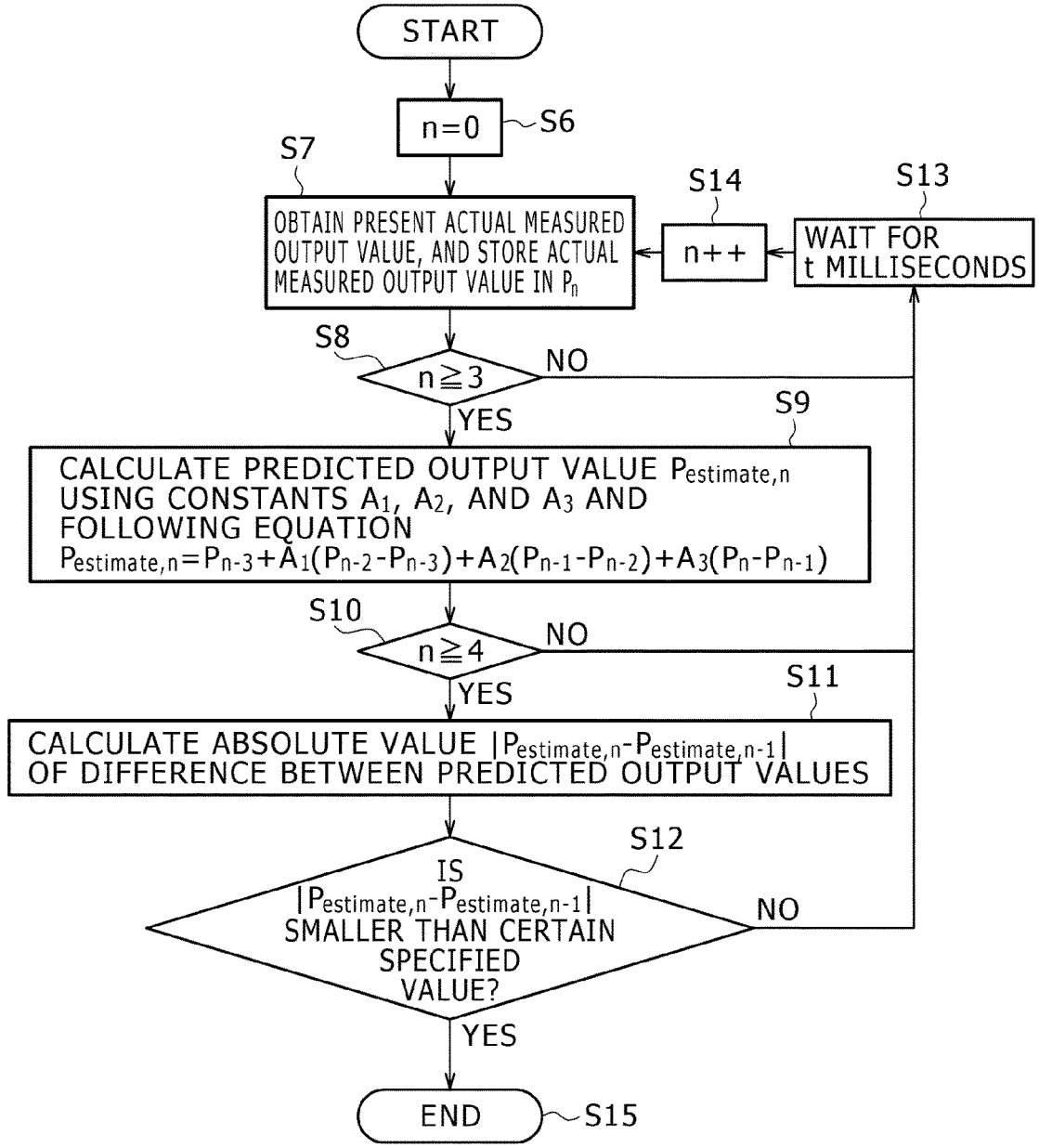
FIG. 3 is a flowchart of an example of control for obtaining the approximate value of a value to be reached by power generation output.

FIG. 3 is a flowchart of an example of control for obtaining the approximate value of the value to be reached by the power generation output.

As shown in FIG. 3, this algorithm determines the value to be reached by the power generation output on the basis of the absolute value of a difference between predicted output values in a preceding loop and a succeeding loop.

The algorithm for obtaining the approximate value of the value to be reached by the power generation output will be described in detail with reference to FIG. 3.

First, initialization is performed by substituting zero into the value of the number of loop times n (step S6).

Next, the actual measured output value $P_n$ of the solar cell is measured, and is stored in $P_n$ in Equation (2) (step S7).

In step S8, when the number n of loop times is less than three, the process waits for t milliseconds (step S13), increments the number n of loop times (step S14), and thereafter returns to the process of step S7. When the number n of loop times is three or more, the process proceeds to step S9.

In step S9, four actual measured output values $P_{n-3}$, $P_{n-2}$, and $P_{n-1}$, obtained by measurement are substituted into Equation (2). In Equation (2), $A_1$, $A_2$, and $A_3$ are arbitrary constants determined in advance such that the limit value of $P_{estimate,n}$ when n of $P_{estimate,n}$ goes toward infinity ($n\to\infty$) substantially coincides with $P_{final}$. In step S9, the predicted output value $P_{estimate,n}$ is obtained.

$$P_{estimate,n} = P_{n-3} + A_1(P_{n-2}-P_{n-3}) + A_2(P_{n-1}-P_{n-2}) + A_3(P_n-P_{n-1}) \tag{2}$$

Next, in step S10, when the number n of loop times is less than four, the process waits for t milliseconds (step S13), increments the number n of loop times (step S14), and thereafter returns to the process of step S7. When the number n of loop times is four or more, the process proceeds to step S11, where the two consecutive predicted output values $P_{estimate,n}$ and $P_{estimate,n-1}$ obtained are substituted into Equation (3) to calculate the absolute value $P_{estimate,diff}$ of a difference between the two predicted output values.

$$P_{estimate,diff} = |P_{estimate,n} - P_{estimate,n-1}| \tag{3}$$

Next, in step S12, whether the absolute value of the difference between the predicted output values which absolute value is obtained in step S11 is smaller than a specified value set in advance is determined. When the absolute value of the difference between the predicted output values is equal to or larger than the specified value, the process waits for t milliseconds (step S13), increments the number n of loop times (step S14), and thereafter returns to the process of step S7. When the absolute value of the difference between the predicted output values is smaller than the specified value, on the other hand, the predicted output value $P_{estimate,n}$ at this point in time is a final predicted output value, that is, the approximate value of the value to be reached by the power generation output. The algorithm is then ended (step S15). The value of the obtained predicted output value $P_{estimate,n}$ is returned to a called external device or the like as required.

The equation for calculating the predicted output value $P_{estimate,n}$ is not limited to Equation (2). For example, a more accurate predicted output value can be obtained by substituting m (m is a natural number of four or more) actual measured output values $P_{n-m}$, $P_{n-m+1}$, $P_{n-m+2}$, ..., $P_{n-1}$, $P_n$ obtained by measurement into Equation (4) and comparing the absolute value of a difference between two consecutive predicted output values. In Equation (4), $A_1$, $A_2$, ..., $A_m$ are arbitrary constants. The number of terms in Equation (4) is m+1.

$$P_{estimate,n} = P_{n-m} + A_1(P_{n-m+1}-P_{n-m}) + A_2(P_{n-m+2}-P_{n-m+1}) + \ldots + A_m(P_n-P_{n-1}) \tag{4}$$

As described above, the algorithm for obtaining the approximate value of the value to be reached does not include any exponential function or the like, and uses only four simple arithmetic operations. Thus, the algorithm eliminates a need for complex processing, and is effective especially in a case where the controller 3 having the output predicting unit 5 is desired to be a controlling microcomputer that consumes a small amount of power and has a low processing power.

In addition, the electrical response speed can be obtained from change in the absolute value of the difference between the predicted output values. The constant b in Equation (1) is derived from the obtained electrical response speed. A degree of degradation of the dye-sensitized solar cell, for example, can be determined on the basis of the constant b.

Example 1-1

Figure 4:
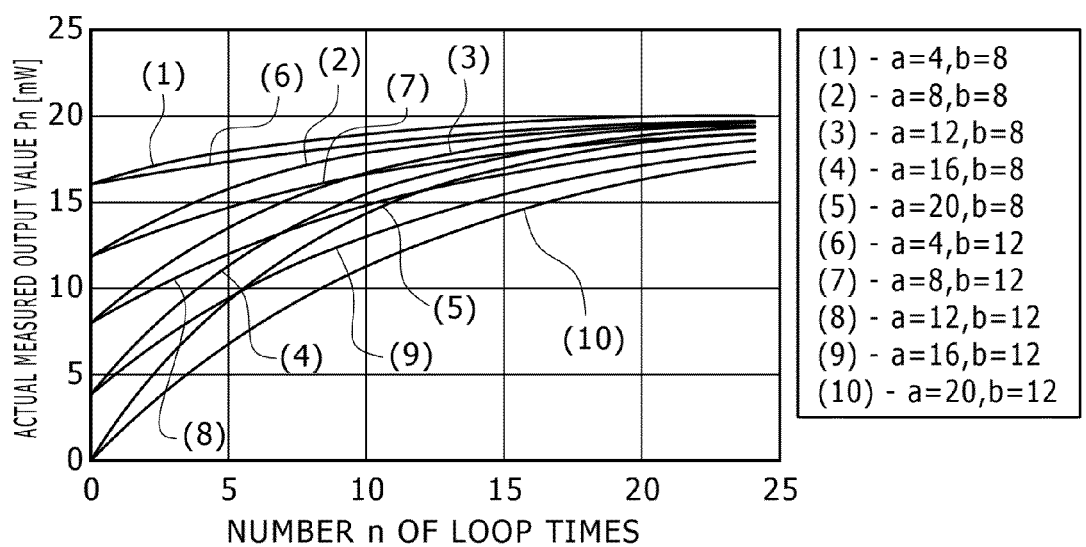
FIG. 4 is a schematic diagram showing a result of calculation of an actual measured output value $P_n$ under conditions of the solar cell.

FIG. 4 is a schematic diagram showing a result of calculation by Equation (1) of the actual measured output value $P_n$ under the conditions of the solar cell having characteristics such that the value of the constant a is in a range of 4 to 20 and the value of the constant b is in a range of 8 to 12. An axis of ordinates in the diagram is the actual measured output value $P_n$ [mW], and an axis of abscissas in the diagram is the number n of loop times [times].

Figure 5:
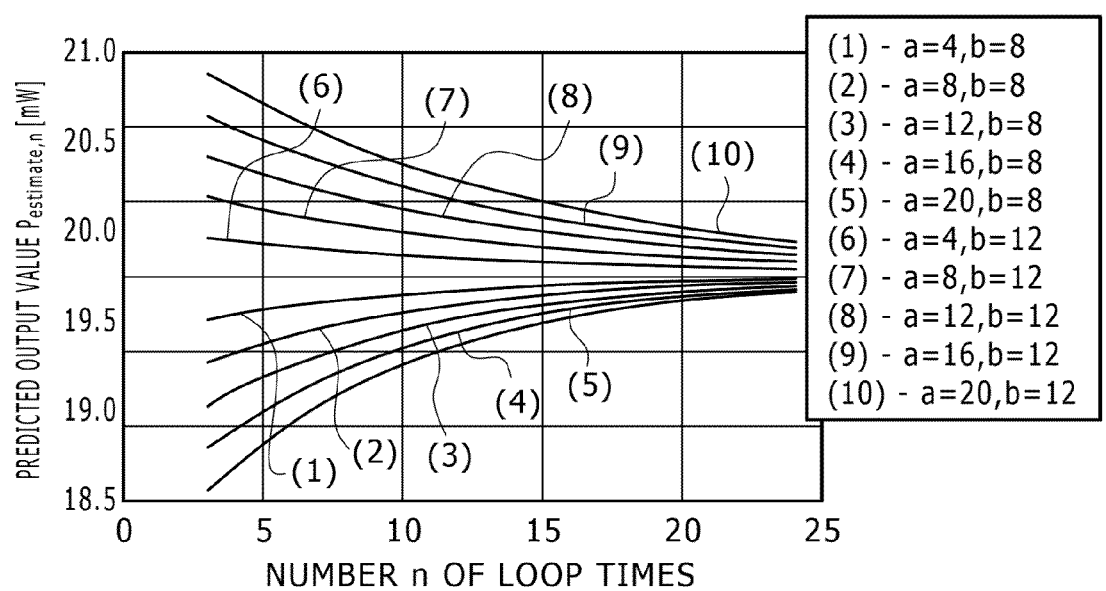
FIG. 5 is a schematic diagram showing a result of calculation of a predicted output value $P_{estimate, n}$ under conditions of the solar cell.

FIG. 5 is a schematic diagram showing a result of calculation by Equation (2) of the predicted output value $P_{estimate, n}$ under the conditions of the solar cell having the above-described characteristics. An axis of ordinates in the diagram is the predicted output value $P_{estimate, n}$ [mW], and an axis of abscissas in the diagram is the number n of loop times [times]. The constants in Equation (2) are set to be $A_1$=530, $A_2$=−1298, and $A_3$=801.

A shown in FIG. 4, the actual measured output value $P_n$ becomes steady when the number n of loop times exceeds about 15, and the value $P_{final}$ to be reached by the output $P_{estimate, \infty}$) is about 20 mW. As shown in FIG. 5, as for the predicted output value $P_{estimate, n}$, the value $P_{final}$ to be reached by the output can be predicted with an error within 1 mW when the number of loop times is n=7, and predicted with an error within 0.5 mW when the number of loop times is n=15.

A method of determining the set value of the power generation voltage which set value provides a maximum power generation efficiency in the controller 3 will next be described in detail.

The set value of the power generation voltage which set value provides a maximum power generation efficiency is determined by searching for an MPP using a four-division search method algorithm in the MPPT control unit 6. The four-division search method is a kind of n-division search method. The n-division search method is an algorithm that finds the power generation voltage providing a maximum power generation efficiency by changing a condition greatly first and thereafter gradually reducing an amount of change in the condition, rather than performing measurement while changing the power generation condition little by little as in the hill climbing method.

The MPPT control unit 6 is called when the condition of illuminance on the solar cell changes greatly or when an amount of power generated is changed greatly, for example. However, the MPPT control unit 6 is not limited to these cases. The MPPT control unit 6 may be called at certain time intervals or according to an amount of change in attitude of the solar cell, for example.

FIG. 6 is a flowchart of a process of searching for an MPP by the four-division search method and setting the value of the power generation voltage. The four-division search method is a kind of n-division search method. In the four-division search method, a load range between a no-load state and a maximum-load state is divided into four parts in a ratio of 1:1:1:1.

As shown in FIG. 6, this algorithm searches for an MPP by the four-division search method and determines the set value of the power generation voltage.

The algorithm for searching for an MPP by the four-division search method and determining the set value of the power generation voltage will be described in detail with reference to FIG. 6.

First, the control of the power generation voltage by the load controller 2 is stopped temporarily, and the load applied to the solar cell is set to zero (step S16).

Next, the process waits for t milliseconds to t seconds to bring the output voltage of the solar cell into a steady state (step S17).

Next, the open-circuit voltage $V_{oc}$ of the solar cell is measured (step S18).

Next, a value obtained by multiplying the measured open-circuit voltage $V_{oc}$ by ½ is set as an initial voltage $V_0$ for the number of loop times m=0 (step S19) as follow:

$$V_0 = \frac{V_{oc}}{2}$$

Next, the set value of the power generation voltage is set to $V_m = V_0$, and the control of the power generation voltage by the load controller 2 is resumed (step S20).

Next, the output predicting unit 5 is called, and a predicted output value returned with the set value of the power generation voltage set at $V_m = V_0$ is stored in $P_{m, 2}$ (step S21).

Next, the set value $V_{m, 1}$ of the power generation voltage is set as follow:

$$V_{m,1} = V_m - \frac{V_{oc}}{2^{m+2}}$$

The output predicting unit 5 is called, and a returned predicted output value is stored in $P_{m, 1}$ (step S22).

Next, the set value $V_{m, 3}$ of the power generation voltage is set as follow:

$$V_{m,3} = V_m + \frac{V_{oc}}{2^{m+2}}$$

The output predicting unit 5 is called, and a returned predicted output value is stored in $P_{m, 3}$ (step S23).

Next, $P_{m, 1}$, $P_{m, 2}$, and $P_{m, 3}$ are compared with each other, and the voltage value at the largest predicted output value and the output value are set as $V_{m+1}$ and $P_{m+1, 2}$, respectively (step S24).

Next, in step S25, when the number of loop times m is equal to or smaller than a certain specified value, the process increments the number of loop times m (step S26), and returns to the process of step S22. When the number of loop times m is larger than the certain specified value, $V_{m+1}$ is the final set value of the power generation voltage, that is, the set value $V_{mpp}$ of the power generation voltage which set value provides a maximum power generation efficiency (step S27). The algorithm is then ended (step S28). The obtained set value $V_{mpp}$ of the power generation voltage is returned to a called external device or the like as required.

Example 1-2

FIGS. 7A to 7E are schematic diagrams showing a process of searching for an MPP using the four-division search method algorithm shown in FIG. 6 and obtaining the set value of the power generation voltage which set value provides a maximum power generation efficiency in the power generation control on the solar cell. An axis of ordinates in the diagrams represents power generation current [mA] and generated power [mW], and an axis of abscissas in the diagrams represents power generation voltage [V].

Figure 7A:
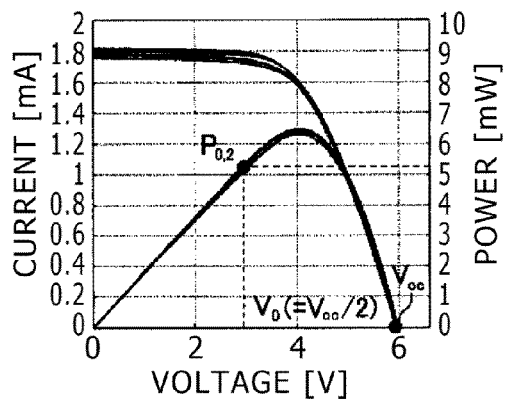
FIGS. 7A, 7B, 7C, 7D, and 7E are schematic diagrams showing a process of obtaining the set value of the power generation voltage which set value provides a maximum power generation efficiency in power generation control on the solar cell.
Figure 7B:
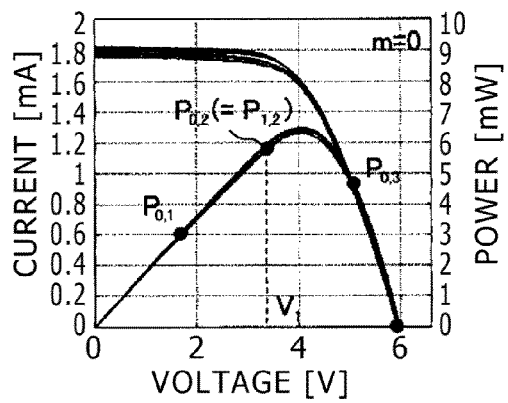
Figure 7C:
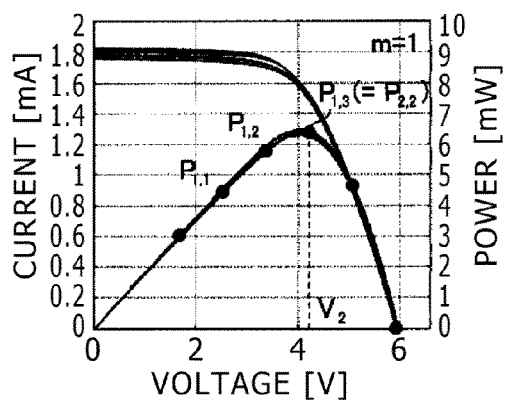
Figure 7D:
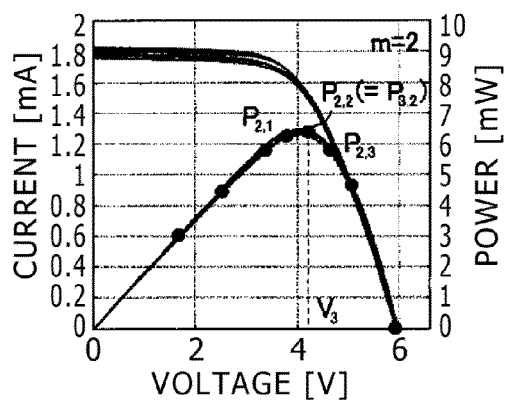
Figure 7E:
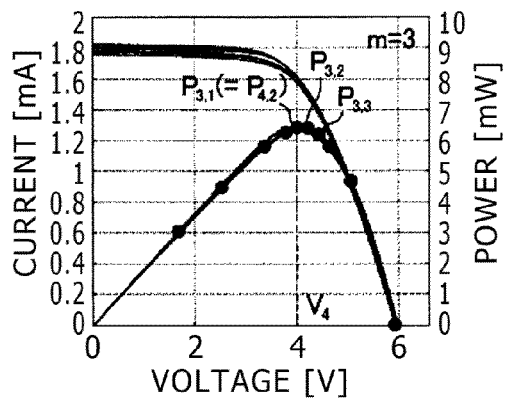

FIG. 7A shows a process in step S19. FIG. 7B shows a process from step S21 to S25 for the number of loop times m=0. FIG. 7C shows a process from step S21 to S25 for the number of loop times m=1. FIG. 7D shows a process from step S21 to S25 for the number of loop times m=2. FIG. 7E shows a process from step S21 to S25 for the number of loop times m=3.

As shown in FIGS. 7A to 7E, when this algorithm is used, a power generation voltage $V_m$ at which power generation can be performed at substantially highest efficiency can be obtained by merely performing nine output measurements. Incidentally, while the resolution of the power generation voltage $V_m$ at this time is $V_{oc}/32$, the resolution is improved drastically when the number of measurements is further increased. For example, the resolution is raised exponentially to $V_{oc}/64$ when 11 output measurements are performed and to $V_{oc}/128$ when 13 output measurements are performed. When the accuracy of the resolution of $V_{oc}/128$ is to be achieved by the hill climbing method, a maximum of 128 output measurements are necessary, and it is almost impossible to obtain a power generation voltage at which power generation can be performed at highest efficiency with only 13 measurements.

In addition, the controller 3 desirably has a self-correcting function when the solar cell is degraded. Specifically, the constants in Equation (1), Equation (2), and Equation (4) can be regarded as parameters, and thus the controller 3 desirably has a self-correcting function that can self-correct optimum values of these respective constants. The self-correcting function can desirably self-correct the parameters by performing automatic verification measurement periodically. The verification measurement specifically includes for example a measurement in which the transient response of the power generation current is measured for a long period of time and whether a result of prediction of a value to be reached by the power generation current and the actually measured reached value coincide with each other is determined. However, the self-correcting function and the verification measurement are not limited to these methods.

The optimum values of the parameters also change according to an ambient temperature. In order to deal with this, it is desirable to measure the ambient temperature by a separate thermistor or the like and correct the parameters on the basis of temperature data obtained. In a case of a low temperature, in particular, the viscosity of the electrolytic solution is increased, and the migration velocity of the ions is decreased, so that the electrical response speed is further slowed. Thus, when a search is made with a certain measurement accuracy maintained, it is desirable to increase the number of pieces of data on the actual measured output value $P_n$ used for output prediction and increase the number of times of search. In a case of a high temperature, on the other hand, the viscosity of the electrolytic solution is decreased, and thus the electrical response speed is increased, so that the number of pieces of data on the actual measured output value $P_n$ used for output prediction can be reduced and the number of times of search can be reduced. When a search is limited to within a certain time and the search is made, on the other hand, it suffices to perform opposite corrections from the case where a search is made with a certain measurement accuracy maintained.

In addition, in actual use in a portable device or the like, the controller 3 repeats the setting of the power generation voltage many times due to rapid changes in illuminance condition and the like. Consideration is therefore given to a load imposed on the solar cell by the setting. In the dye-sensitized solar cell, in particular, it is desirable to reduce conditions in which the set value of the power generation voltage is too low or too high as much as possible. This is because too high a set value of the power generation voltage facilitates reductive elimination reaction of the dye adsorbed by the titanium oxide electrode, whereas too low a set value of the power generation voltage facilitates the elution of silver used in collecting wiring or the like. In order to prevent these conditions, it is desirable to narrow the range of the set value of the power generation voltage so that the set value of the power generation voltage is not less than $0.1 \cdot V_{oc}$ and is not $0.9 \cdot V_{oc}$ or more when searching for a power generation voltage $V_{max}$ in the case where power generation is performed at highest efficiency.

In addition, when power generation control is desired to be performed at high speed as in a case of use in a portable device or the like, it is effective to apply the above-described algorithm while reducing the number of times of search as appropriate by not setting the load condition to a no-load condition (V=0) and/or a maximum-load condition (I=0) intentionally, determining in advance that the MPP is in a range of $V_{oc}/2$ to $V_{oc}$, or determining in advance that the MPP is in the vicinity of the power generation voltage $V_{max}$ measured previously because it is not often that the power generation voltage $V_{max}$ changes greatly, rather than searching for the power generation voltage $V_{max}$ in the state of highest efficiency in the entire range of 0 to $V_{oc}$.

As described above, the solar cell system according to the first embodiment has the configuration obtained by combining the load controller with the output predicting unit and the MPPT control unit. Thus, power generation can be performed at maximum efficiency at all times without depending on the electrical response speed of the solar cell. Further, power generation control on the solar cell is performed by predicting the value to be reached by the output in transient response on the basis of a difference between predicted output values in the output predicting unit and searching for the MPP by the four-division search method in the MPPT control unit. Thus, even when the solar cell is used in an environment where the illuminance condition changes rapidly, power generation control can be performed while variations in the MPP are followed quickly. Specifically, the output predicting unit quickly predicts the value to be reached by the output without being affected by the electrical transient response characteristic of the solar cell, and the MPPT control unit finds a condition for maximum efficiency with a minimum number of trials, whereby power generation control can be performed while variations in the MPP are followed quickly. That is, a solar cell system can be provided which can generate power at maximum efficiency at all times even when the output characteristic of the solar cell varies.

In addition, the constant b in positive correlation with the slowness of the electrical response speed can be obtained from change in absolute value of the difference between the predicted output values. A degree of degradation of the dye-sensitized solar cell, for example, can be determined on the basis of the constant b. In addition, a decrease in voltage $V_{max}$ at the MPP is confirmed simultaneously with an increase in direct-current resistive component $R_s$ due to secular degradation of the dye-sensitized solar cell. Thus, this phenomenon can be used to quantify the degree of degradation of the dye-sensitized solar cell.

In addition, the I-V output characteristic and the P-V output characteristic of the solar cell can be determined by obtaining approximate curves from all power generation voltage values set in the MPPT control unit.

In addition, power generation control on the solar cell can be realized by a controlling microcomputer that consumes a small amount of power and has a low processing power by configuring the algorithms used for output prediction by the output predicting unit and MPP search in the MPPT control unit with only four simple arithmetic operations. This makes it possible to provide a solar cell system having a high total power generation efficiency.

2. Second Embodiment

[Solar Cell System]

Figure 8:
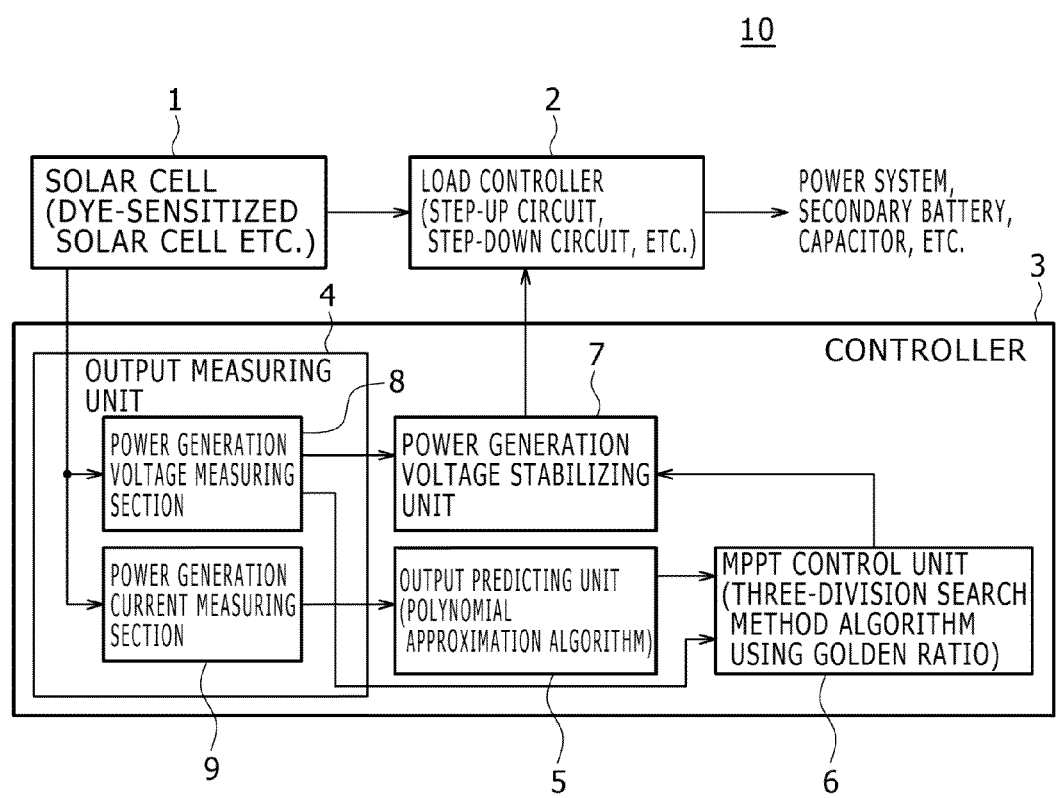
FIG. 8 is a block diagram showing a solar cell system according to a second embodiment.

FIG. 8 is a block diagram showing a solar cell system according to a second embodiment.

As shown in FIG. 8, the solar cell system 10 according to the second embodiment searches for an MPP by a three-division search method using a golden ratio in place of the four-division search method in the MPPT control unit 6 of the solar cell system 10 according to the first embodiment, and determines the set value of the power generation voltage. The three-division search method using a golden ratio is a kind of n-division search method, and divides a load range between a no-load state and a maximum-load state into three parts in a golden ratio.

[Operation of Solar Cell System]

Figure 9:
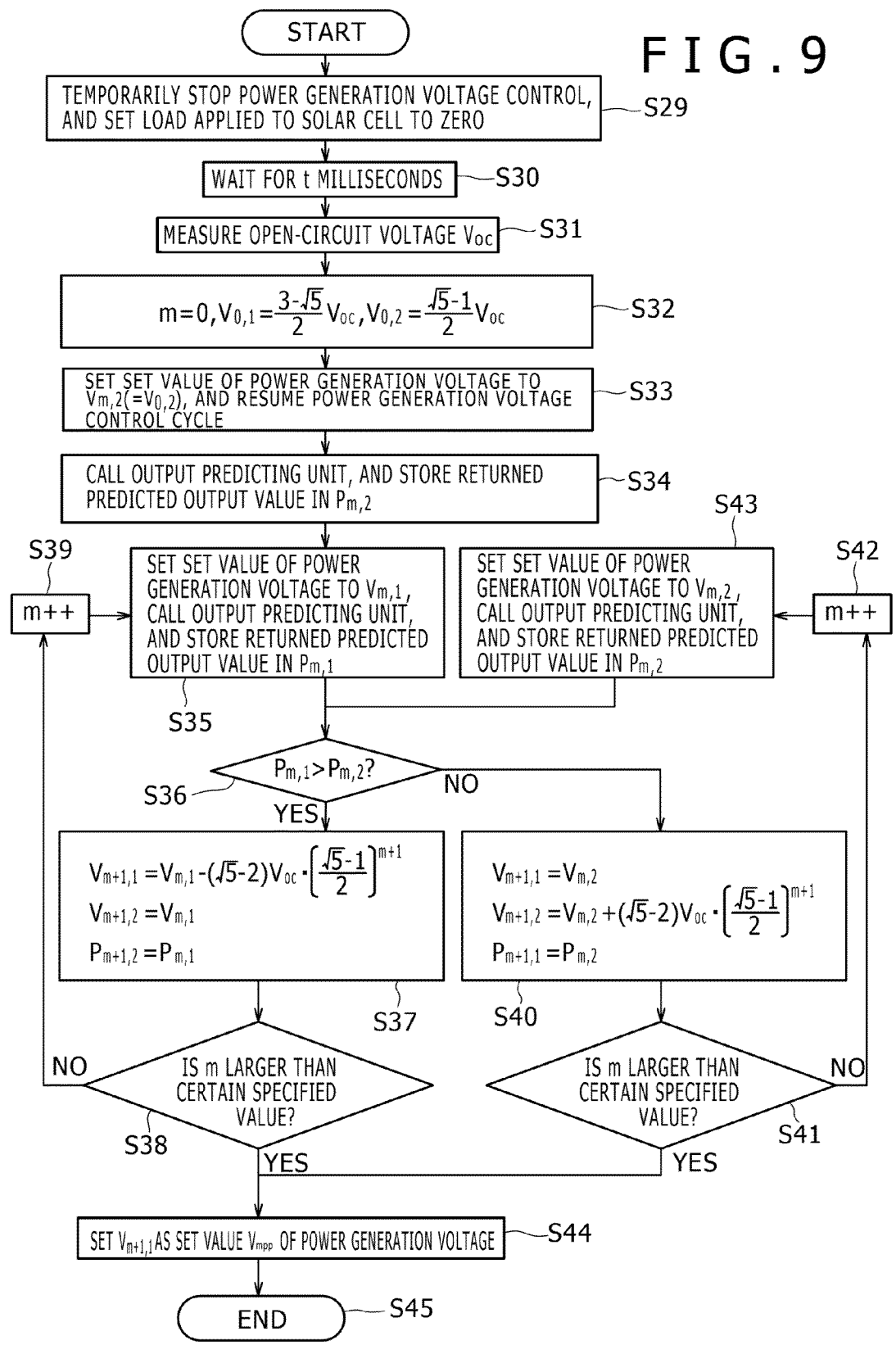
FIG. 9 is a flowchart of a process of searching for an MPP by a three-division search method using a golden ratio and setting the value of the power generation voltage.

FIG. 9 is a flowchart of a process of searching for an MPP by the three-division search method using a golden ratio and setting the value of the power generation voltage.

The golden ratio is a ratio expressed by the following equation:

$$1 : \frac{\sqrt{5}-1}{2} : 1$$

As shown in FIG. 9, this algorithm searches for an MPP by the three-division search method using the golden ratio, and determines the set value of the power generation voltage.

The algorithm for searching for an MPP by the three-division search method using the golden ratio and determining the set value of the power generation voltage will be described in detail with reference to FIG. 9.

First, the control of the power generation voltage by a load controller 2 is stopped temporarily, and a load applied to a solar cell is set to zero (step S29).

Next, the process waits for t milliseconds to t seconds to bring the output voltage of the solar cell into a steady state (step S30).

Next, the open-circuit voltage $V_{oc}$ of the solar cell is measured (step S31).

Next, initial voltages $V_{0,1}$ and $V_{0,2}$ for the number of loop times m=0 are set as follows (step S32):

$$V_{0,1} = \frac{3-\sqrt{5}}{2} V_{oc}$$

$$V_{0,2} = \frac{\sqrt{5}-1}{2} V_{oc}$$

Next, the set value of the power generation voltage is set to $V_{m,2}=V_{0,2}$, and the power generation control by the load controller 2 is resumed (step S33).

Next, the output predicting unit 5 is called, and a predicted output value returned with the set value of the power generation voltage set at $V_m=V_0$ is stored in $P_{m,2}$ (step S34).

Next, the set value of the power generation voltage is set to $V_{m,1}$, the output predicting unit 5 is called, and a returned predicted output value is stored in $P_{m,1}$ (step S35).

Next, the magnitudes of the predicted output values stored in $P_{m,1}$ and $P_{m,2}$ are compared with each other. When $P_{m,1}$ is larger than $P_{m,2}$, the process proceeds to step S37. When $P_{m,1}$ is not larger than $P_{m,2}$, on the other hand, the process proceeds to step S40 (step S36).

When the process proceeds from step S36 to step S37, the set values $V_{m+1,1}$ and $V_{m+1,2}$ of the power generation voltage and a predicted output value $P_{m+1,2}$ are respectively set as follows (step S37):

$$V_{m+1,1} = V_{m,1} - (\sqrt{5}-2)V_{oc} \cdot \left(\frac{\sqrt{5}-1}{2}\right)^{m+1}$$

$$V_{m+1,2} = V_{m,1}$$

$$P_{m+1,2} = P_{m,1}$$

Next, in step S38, when the number of loop times m is equal to or smaller than a certain specified value, the process increments the number of loop times m (step S39), and returns to the process of step S35. When the number of loop times m is larger than the certain specified value, $V_{m+1,1}$ is the final set value of the power generation voltage, that is, the set value $V_{mpp}$ of the power generation voltage which set value provides a maximum power generation efficiency (step S44). The algorithm is then ended (step S45). The obtained set value $V_{mpp}$ of the power generation voltage is returned to a called external device or the like as required.

When the process proceeds from step S36 to step S40, the set values $V_{m+1,1}$ and $V_{m+1,2}$ of the power generation voltage and the predicted output value $P_{m+1,1}$ are respectively set as follows (step S40):

$$V_{m+1,1} = V_{m,2}$$

$$V_{m+1,2} = V_{m,2} + (\sqrt{5}-2)V_{oc} \cdot \left(\frac{\sqrt{5}-1}{2}\right)^{m+1}$$

$$P_{m+1,1} = P_{m,2}$$

Next, in step S41, when the number of loop times m is equal to or smaller than the certain specified value, the process increments the number of loop times m (step S42), and returns to the process of step S43 (step S41). In step S43, the set value of the power generation voltage is set to $V_{m,2}$, the output predicting unit 5 is called, and a returned predicted output value is stored in $P_{m,2}$ (step S43). The process then returns to step S36. When the number of loop times m is larger than the certain specified value, on the other hand, $V_{m+1,1}$ is the final set value of the power generation voltage, that is, the set value $V_{mpp}$ of the power generation voltage which set value provides a maximum power generation efficiency (step S44). The algorithm is then ended (step S45). The obtained set value $V_{mpp}$ of the power generation voltage is returned to a called external device or the like as required.

Example 2-1

FIGS. 10A to 10F are schematic diagrams showing a process of searching for an MPP using the three-division search method algorithm using the golden ratio which algorithm is shown in FIG. 9 and obtaining the set value of the power generation voltage which set value provides a maximum power generation efficiency in the power generation control on the solar cell. An axis of ordinates in the diagrams represents power generation current [mA] and generated power [mW], and an axis of abscissas in the diagrams represents power generation voltage [V].

Figure 10A:
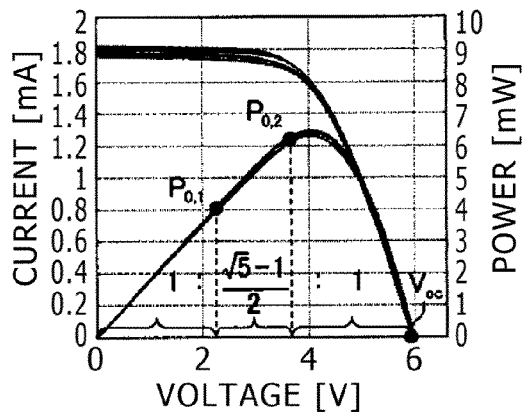
FIGS. 10A, 10B, 10C, 10D, 10E, and 10F are schematic diagrams showing a process of setting the value of the power generation voltage which value provides a maximum power generation efficiency in power generation control on the solar cell.
Figure 10B:
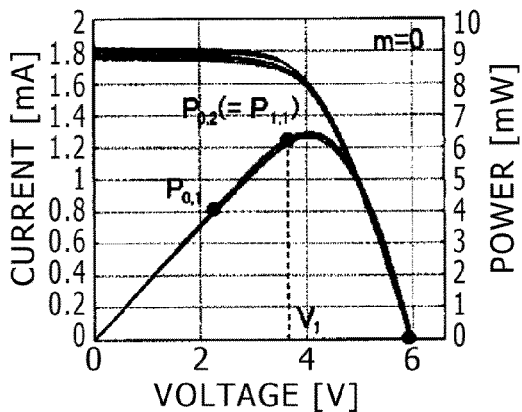
Figure 10C:
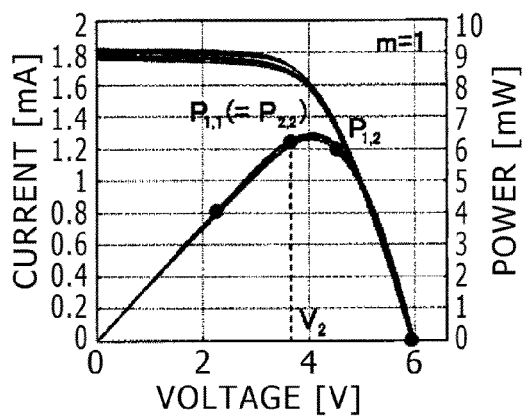
Figure 10D:
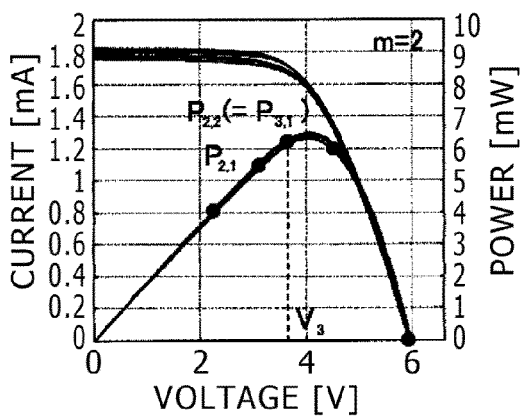
Figure 10E:
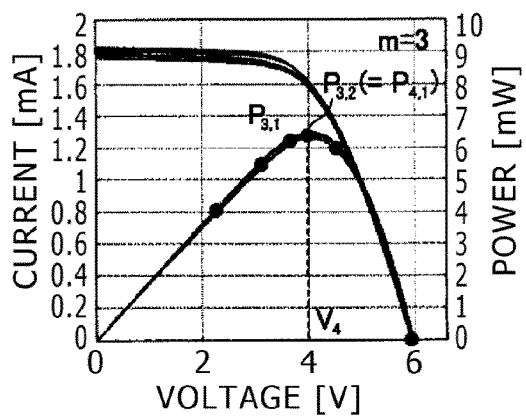
Figure 10F:
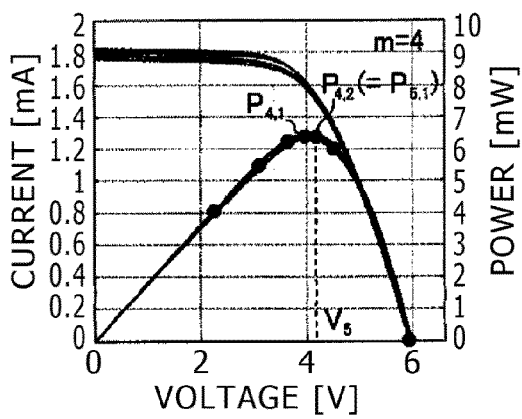

FIG. 10A shows a process from step S29 to step S34. FIG. 10B shows a process from step S35 to step S43 for the number of loop times m=0. FIG. 10C shows a process from step S35 to step S39 for the number of loop times m=1. FIG. 10D shows a process from step S35 to step S43 for the number of loop times m=2. FIG. 10E shows a process from step S35 to step S43 for the number of loop times m=3. FIG. 10F shows a process from step S35 to step S45 for the number of loop times m=4.

As shown in FIGS. 10A to 10F, when this algorithm is used, a power generation voltage $V_m$ providing a state of substantially highest efficiency can be obtained by merely performing six output measurements, and the MPP can be grasped more quickly than in the four-division search method. A reason for this is that region division is performed recursively according to the golden ratio, and thus only one output measurement suffices for one loop when a predicted output value calculated in an immediately preceding loop is reused. Incidentally, while the resolution of the power generation voltage $V_m$ at this time is $V_{oc}/32$, the resolution is improved drastically when the number of measurements is further increased, as in the four-division search method. For example, the resolution becomes $V_{oc}/64$ when seven output measurements are performed, and becomes $V_{oc}/128$ when eight output measurements are performed. The resolution is thus raised exponentially.

Thus, the three-division search method using the golden ratio can reduce the number of measurements most among n-division search methods, and is therefore effective especially when the MPP is desired to be grasped quickly. A calculation processing speed when the controller 3 is for example a controlling microcomputer is desirably sufficient to perform the above-described process. The solar cell system according to the second embodiment is otherwise similar to the solar cell system according to the first embodiment.

As described above, in addition to similar advantages to those of the solar cell system according to the first embodiment, the solar cell system according to the second embodiment searches for the MPP by the three-division search method using the golden ratio in place of the four-division search method and determines the set value of the power generation voltage in the MPPT control unit 6. Thus, a power generation voltage providing a state of highest efficiency can be obtained in a shorter time and with high accuracy.

3. Third Embodiment

[Solar Cell System]

Figure 11:
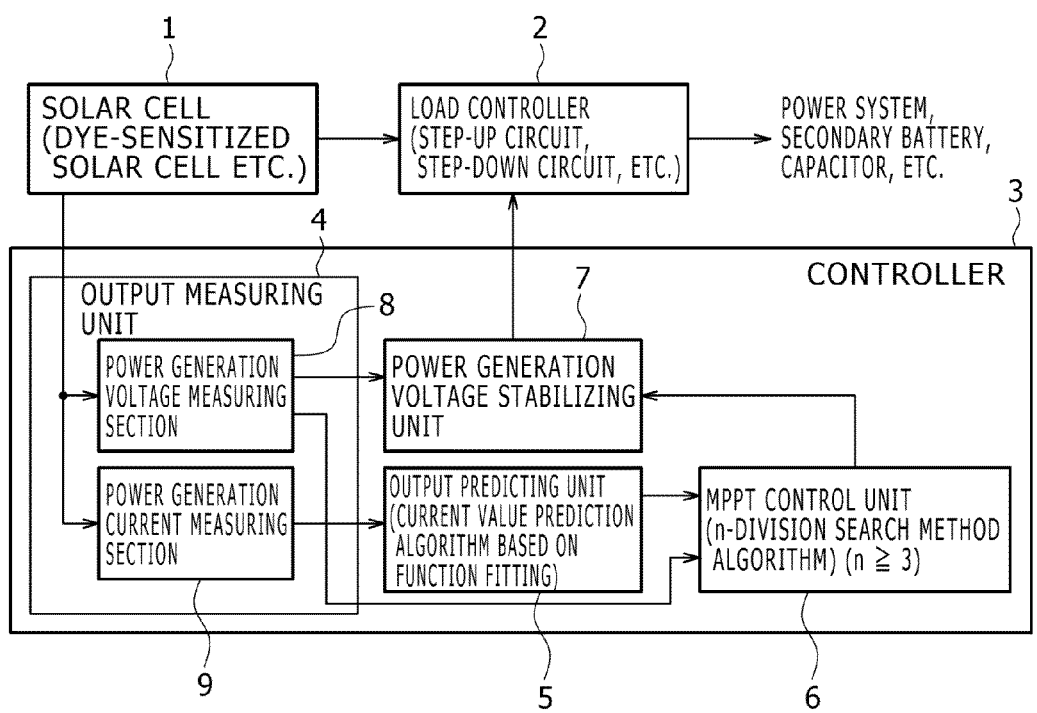
FIG. 11 is a block diagram showing a solar cell system according to a third embodiment.

FIG. 11 is a block diagram showing a solar cell system according to a third embodiment.

As shown in FIG. 11, the solar cell system 10 according to the third embodiment predicts a value to be reached by a power generation current by fitting the value of the power generation current to the value of an inverse function or an exponential function in the output predicting unit 5 of the solar cell system according to the first or second embodiment, and sets this value as a predicted current value.

[Operation of Solar Cell System]

Figure 12:
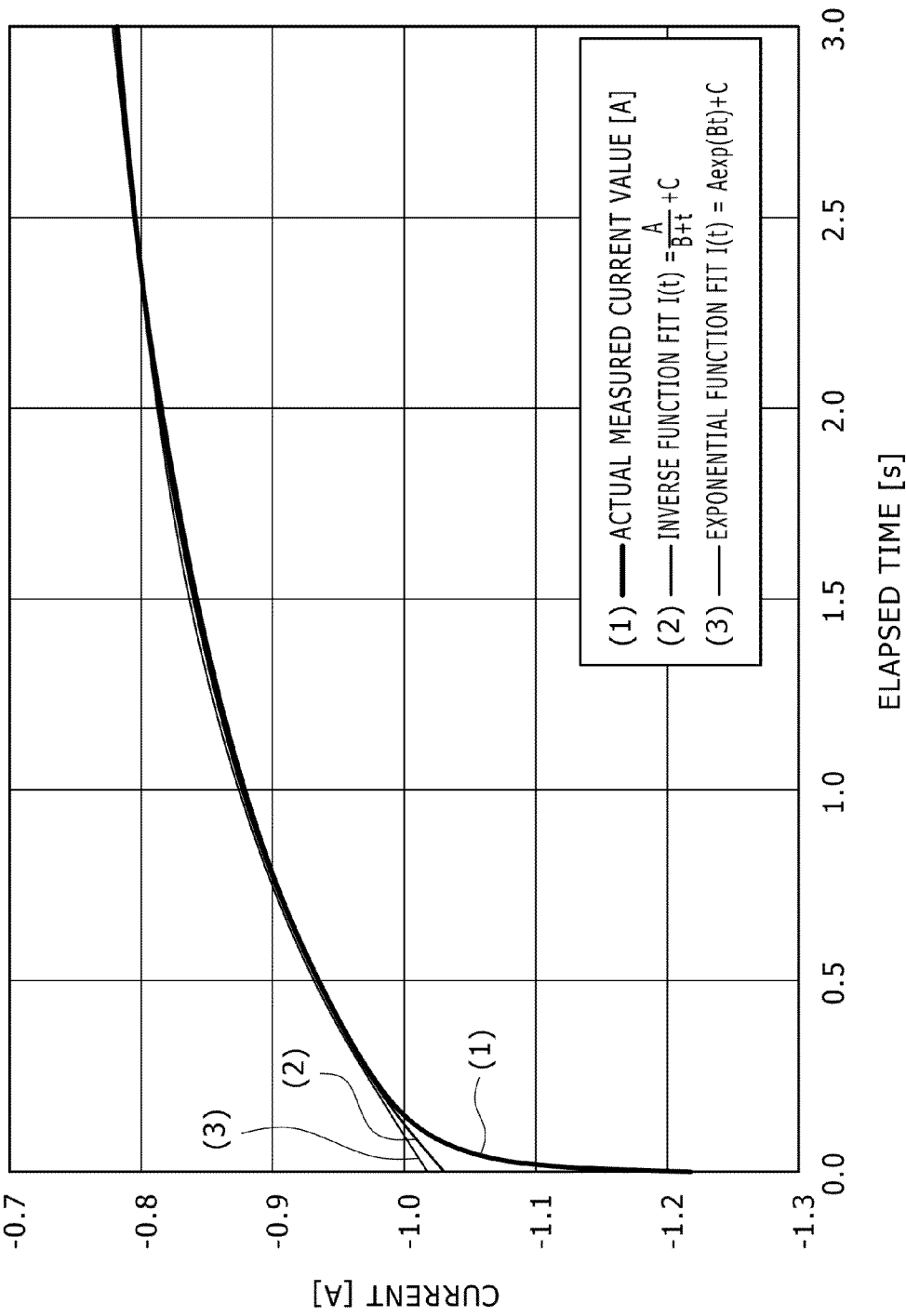
FIG. 12 is a schematic diagram showing the electrical response characteristic of a dye-sensitized solar cell.

FIG. 12 is a schematic diagram showing the fitting of an arbitrary inverse function and an arbitrary exponential function to the electrical transient response characteristic of a current occurring when a voltage $V_{bt}$ between the terminals of a dye-sensitized solar cell is changed from an open-circuit state to 0.8 V. An axis of ordinates in the diagram represents the current [A], and an axis of abscissas in the diagram represents an elapsed time [s]. In addition, $V_{bt}$<0.8 V.

As shown in FIG. 12, a current occurs when a certain voltage is applied to the dye-sensitized solar cell, and the current exhibits a transient response characteristic. A final value to be reached by the current can be predicted by fitting an asymptotic approach to the value to be reached by the current according to such transient response of the current by using an inverse function or an exponential function. However, not all values of the transient response of the power generation current occurring in the dye-sensitized solar cell can be fitted by using an inverse function or an exponential function due to an effect of an inrush current immediately after application of voltage.

Accordingly, an output predicting unit 5 according to the third embodiment eliminates the effect of the inrush current and predicts the value to be reached by the current by fitting only values of the current measured within a specific time by a power generation current measuring section 9 to an inverse function or an exponential function.

Figure 13:
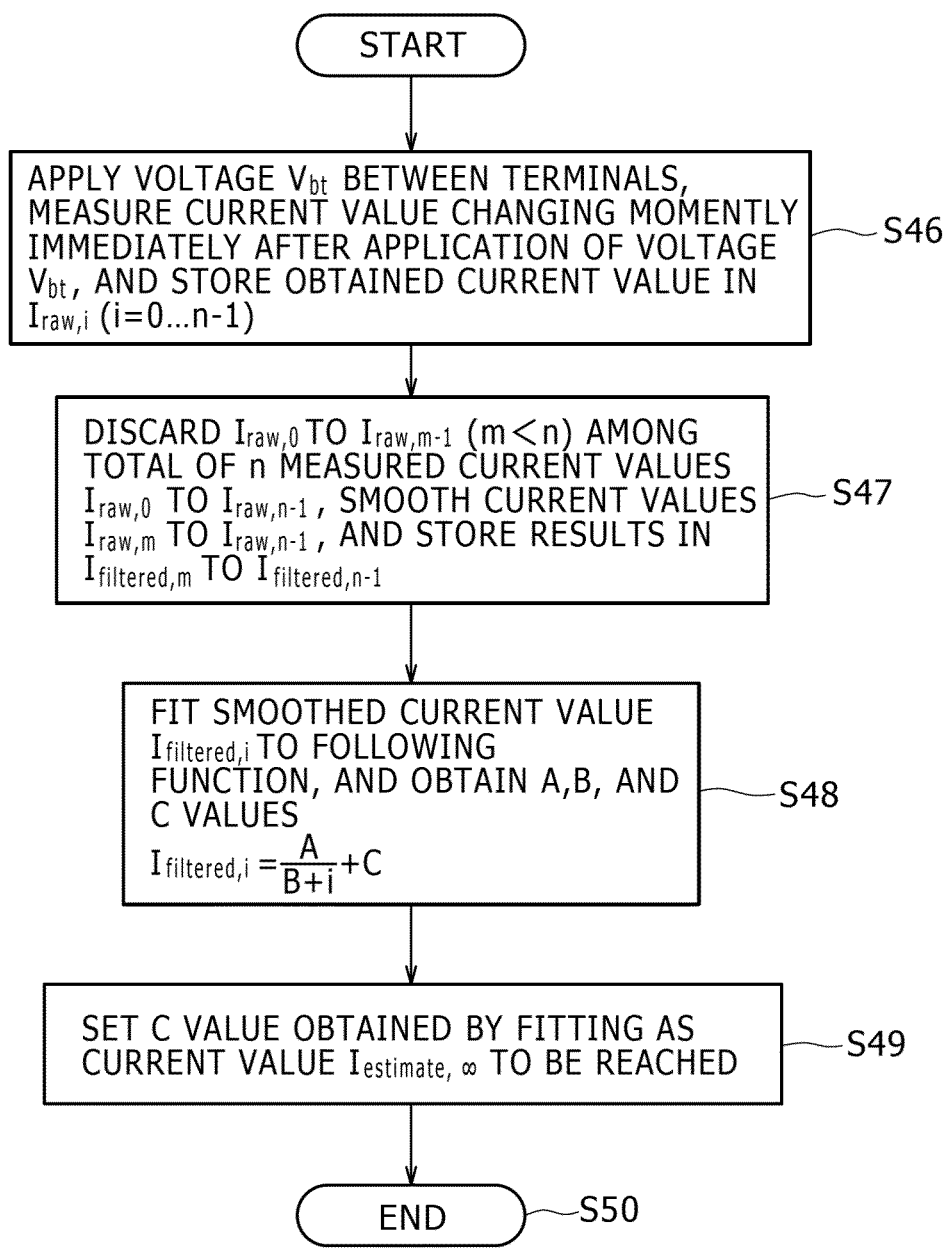
FIG. 13 is a flowchart of an example of control for obtaining the approximate value of a value to be reached by a power generation current.
Figure 14:
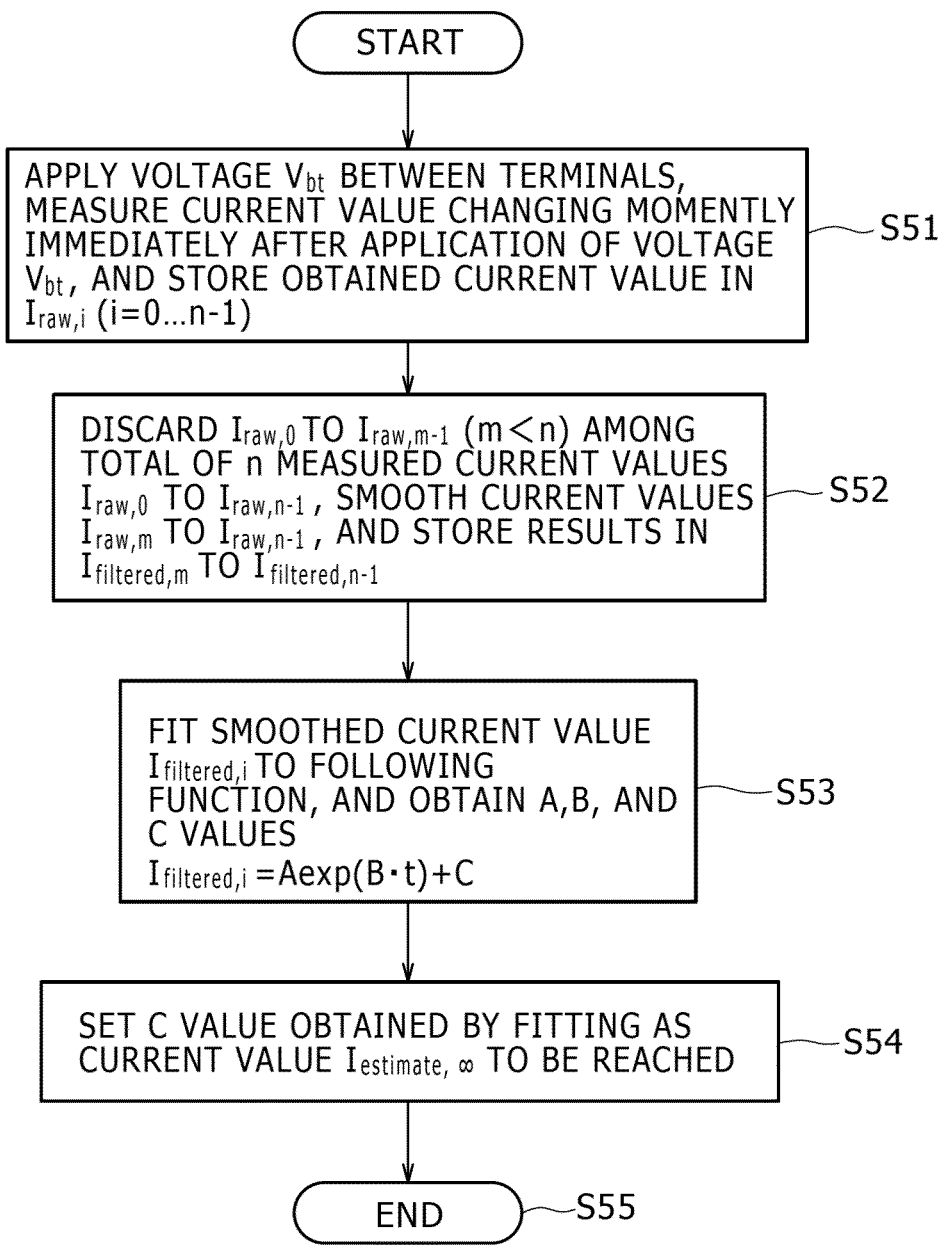
FIG. 14 is a flowchart of an example of control for obtaining the approximate value of the value to be reached by the power generation current.

FIG. 13 and FIG. 14 are flowcharts of an algorithm for obtaining the value to be reached by the current.

As shown in FIG. 13 and FIG. 14, this algorithm can obtain the value to be reached by the current by fitting the asymptotic approach of the current value to the value of an exponential function or the value of an inverse function. This algorithm is broadly described in four steps. The steps are specifically a first step of measuring and obtaining current response occurring when a voltage is applied between the terminals, a second step of removing an inrush current component and a noise component from data on the obtained current response, a third step of fitting the asymptotic component of the current response data to a function, and a fourth step of determining a voltage providing a maximum output using a golden ratio dividing method. The four processes are performed to determine the value to be reached by the current.

The algorithm for obtaining the value to be reached by the current will be described in detail with reference to FIG. 13.

First, a voltage $V_{bt}$ is applied between the terminals, a current value changing momently immediately after the application of the voltage $V_{bt}$ is measured, and the obtained current value is stored in $I_{raw}$. Specifically, for example, a loop process is performed a specified number of times at equal time intervals for the measurement and obtainment of the current value, and the obtainment of the actual measured current value is ended when the number of actual measured current values has reached a specified value (step S46).

Next, of n measured current values $I_{raw,\,0}$ to $I_{raw,\,n-1}$ obtained, measured current values $I_{raw,\,0}$ to $I_{raw,\,m-1}$ (m<n) are discarded, the remaining measured current values $I_{raw,\,m}$ to $I_{raw,\,n-1}$ are smoothed, and the results are stored in $I_{filtered,\,m}$ to $I_{filtered,\,n-1}$ (step S47). The measured current values $I_{raw,\,0}$ to $I_{raw,\,m-1}$ are discarded because the effect of an inrush current immediately after the voltage is changed needs to be eliminated. In addition, noise superimposed on the measured current values is removed by smoothing the measured current values $I_{raw,\,m}$ to $I_{raw,\,n-1}$. Specifically, an exponential moving average filter, for example, is used for the noise removal. An exponential moving average filter as expressed by Equation (5), for example, can be used. In Equation (5), $\alpha$ is an arbitrary constant, and an actual measured current value $I_n$ is sequentially substituted for $I_{raw,\,i}$. For example, supposing that m (n>m) actual measured current values $I_n$ are removed to eliminate the effect of the inrush current, actual measured current value data $I_m$ is substituted for $I_{raw,\,i}$ at i=0, and the smoothed current value $I_{filtered,\,i}$ is sequentially obtained by the sequential substitution up to $I_n$. i is a natural number, and has a relation i≥m.

$$I_{filtered,i} = \alpha I_{raw,i} + (1-\alpha) I_{filtered,i-1} \quad (5)$$

Next, the obtained smoothed current value $I_{filtered,\,i}$ and an inverse function are fitted to each other (step S48). The smoothed current value $I_{filtered,\,i}$ preceding a last obtained smoothed current value $I_{filtered,\,i}$ by a specified number is desirably used as the smoothed current value $I_{filtered,\,i}$ to be fitted to the inverse function. Specifically, for example, when p smoothed current values $I_{filtered,\,i}$ are used for fitting to the inverse function, a smoothed current value $I_{filtered,\,i}$ preceding a last value by p among the smoothed current values $I_{filtered, i}$ obtained in step S47 may be obtained. Alternatively, in step S46, a process may be performed which substitutes actual measured current value data $I_n$ at i=0, increments i and decrements n, repeats the obtainment of the current value until the value of i becomes equal to p, and proceeds to step S47 when the value of i becomes equal to p. However, the obtainment of the smoothed current value $I_{filtered, i}$ is not limited to these methods. In addition, n current values measured consecutively by the power generation current measuring section 9 after the passage of a certain time from the application of the voltage may be smoothed, and the n smoothed currents may be fitted to the inverse function. In addition, p is a natural number, and has a relation p>n−m.

The inverse function I(t) used for the fitting is expressed by Equation (6).

$$I(t) = \frac{A}{B+t} + C \quad (6)$$

In Equation (6), A, B, and C are constants, and t is time. Supposing that t is infinite in Equation (6), the value of the inverse function I(t) is C, which is a value to be reached by the current and to be obtained. It therefore suffices in practice to obtain only C. Thus, the value of C obtained by the fitting to Equation (6) is a current value $I_{estimate, \infty}$ to be reached as a final value to be reached by the current.

The algorithm for fitting the smoothed current value $I_{filtered, i}$ to the value of the inverse function and predicting the value to be reached by the current will be described below in more detail.

In order to obtain the value of C, Equation (6) as the fitting function is modified into Equation (7).

$$\frac{1}{I(t) - C} = \frac{t + B}{A} = R \quad (7)$$

Equation (7) can be treated as a linear function. In Equation (7), a correlation coefficient R is increased as the value of I(t) becomes closer to the value of C. Thus, the value of C that maximizes the value of R will be obtained.

An example of obtaining the value of C that maximizes the value of R will be described in the following.

The correlation coefficient R is specifically expressed by Equation (8), for example.

$$R = \frac{\sum_{i=m}^{n-1}(x_i - x_{avr})(y_i - y_{avr})}{\sqrt{\sum_{i=m}^{n-1}(x_i - x_{avr})^2}\sqrt{\sum_{i=m}^{n-1}(y_i - y_{avr})^2}} \quad (8)$$

$x_{ave}$ and $y_{ave}$ in Equation (8) are the average values of $x_i$ and $y_i$, respectively, and can therefore be expressed as Equation (9)

$$x_{avr} = \frac{\sum_{i=m}^{n-1} x_i}{n-m}, \quad y_{avr} = \frac{\sum_{i=m}^{n-1} y_i}{n-m} \quad (9)$$

In this case, n and m in Equation (9) are variables defined in the algorithm shown in FIG. 13.

In this case, $x_i$ and $y_i$ are as follow:

$$x_i = i, \quad y_i = \frac{1}{I_{filtered, i} - C}$$

Hence, a search is made for the value of C that brings the value of R closest to one, and the obtained value of C is the current value $I_{estimate, \infty}$ to be reached.

The correlation coefficient R can also be obtained by substituting the value of C into Equation (7). In this case, the current value $I_{estimate, \infty}$ to be reached which value is to be obtained is within a search range of C determined by the smoothed current value of the current value obtained. The search range of C therefore needs to be set in order to make a quick search.

The search range of C can be expressed by following two equations:

$$C_{min} = rI_{last} - (r-1)I_{first} - r|I_{last} - I_{first}| \quad (10)$$

$$C_{max} = rI_{last}(r-1)I_{first} - r|I_{last} - I_{first}| \quad (11)$$

In this case, $C_{min}$ is a lower limit value of the search range of C, and $C_{max}$ is an upper limit value of the search range of C. $I_{first}$ is the smoothed current value of a current value obtained first among the current values used for the fitting to the inverse function. $I_{last}$ is the smoothed current value of a current value obtained last among the current values used for the fitting to the inverse function. r (r>0) is a parameter indicating the width of the search range. As the value of r is increased, the search range of C is widened, but convergence takes time. Therefore the value of r is desirably set at a minimum necessary for searching for C.

Thus, the correlation coefficient R is obtained by substituting the value of C within the above-described set range into Equation (7). C that maximizes the correlation coefficient R is the current value $I_{estimate, \infty}$ to be reached, which value is to be obtained.

The current value $I_{estimate, \infty}$ to be reached which value is obtained by using these methods or the like is the predicted current value to be obtained (step S49). The process is then ended (step S50). The obtained predicted current value is multiplied by the set value of the power generation voltage as required, and a result of the multiplication is returned as a predicted output value to a called external device or the like.

As shown in FIG. 14, the current value $I_{estimate, \infty}$ to be reached can also be obtained by Equation (12) using an exponential function, for example, in place of Equation (6) as a fitting function.

$$I(t) = A \exp(Bt) + C \quad (12)$$

In Equation (12), A, B, and C are constants, and t is time. Supposing that t is infinite in Equation (12), the value of the function is C, which is the current value $I_{estimate, \infty}$ to be reached and to be obtained. It therefore suffices to obtain only C as in the case where the fitting is performed using Equation (6).

As with Equation (6), Equation (12) is modified into Equation (13).

$$\log(I(t) - C) = Bt + \log(A) \quad (13)$$

Equation (13) can be treated as a linear function. In Equation (13), the correlation coefficient R is increased as the value of I(t) becomes closer to the value of C. Thus, the value of C that maximizes the value of R is obtained as in the case where the fitting function is Equation (7).

In an example of obtaining the value of C that maximizes the value of R as described above, a process of obtaining a current value (step S51) and extracting only a transient component from the obtained current value (step S52) is performed as in step S47 and step S48, and the fitting is performed with Equation (12) set as a fitting function (step S53). In this case, $x_i$ and $y_i$ in Equation (8) and Equation (9) are as follow:

$$x_i = i, y_i = \log(I_{filtered,i} - C)$$

In an otherwise similar manner to the case where Equation (6) is used as the fitting function, a search is made for the value of C that brings the value of R closest to one, and the obtained value of C is the current value $I_{estimate, \infty}$ to be reached (step S54). The process is then ended (step S55).

In order to predict the value to be reached by the current from the waveform of transient response of the current with high accuracy in the algorithm for obtaining the value to be reached by the current, it may be necessary to appropriately set in advance the number of pieces of data to be obtained, the a value of the exponential moving average filter, the number of pieces of actual measured current value data not to be subjected to the exponential moving average filter, the number of pieces of smoothed current value data used for the fitting, the function to which to perform the fitting (whether the function is the exponential function or the inverse function), or the like. In this case, the settings are preferably made in consideration of the following.

A large dye-sensitized solar cell to be measured means a large inrush current and a large time constant. Thus, as the area of the cell to be measured is increased, a larger value is preferably set as the number of pieces of actual measured current value data not to be subjected to the exponential moving average filter.

In addition, in order to predict the transient response of the current with high accuracy, measurement time itself is preferably lengthened. Because the measurement time is lengthened, on the other hand, the number of pieces of data to be obtained is preferably set as small as possible while a balance between the measurement time and prediction accuracy is considered. However, even when a large transient response with a slow electrical response speed is to be fitted with an exponential function on the basis of a small number of pieces of data, it is often that the fitting cannot be performed well. In such a case, the settings are preferably made such that the inverse function is used for the fitting instead of the exponential function.

In addition, causes of changes in output characteristic include an increase in direct-current resistive component $R_s$ due to degradation of the cell. In this case, the resistive component is increased and the time constant of the transient response is increased. It is thus preferable to increase the number of pieces of data to be obtained or the number of pieces of data used for the fitting accordingly.

Other considerations are similar to those of the solar cell system according to the first or second embodiment.

Example 3-1

Figure 15:
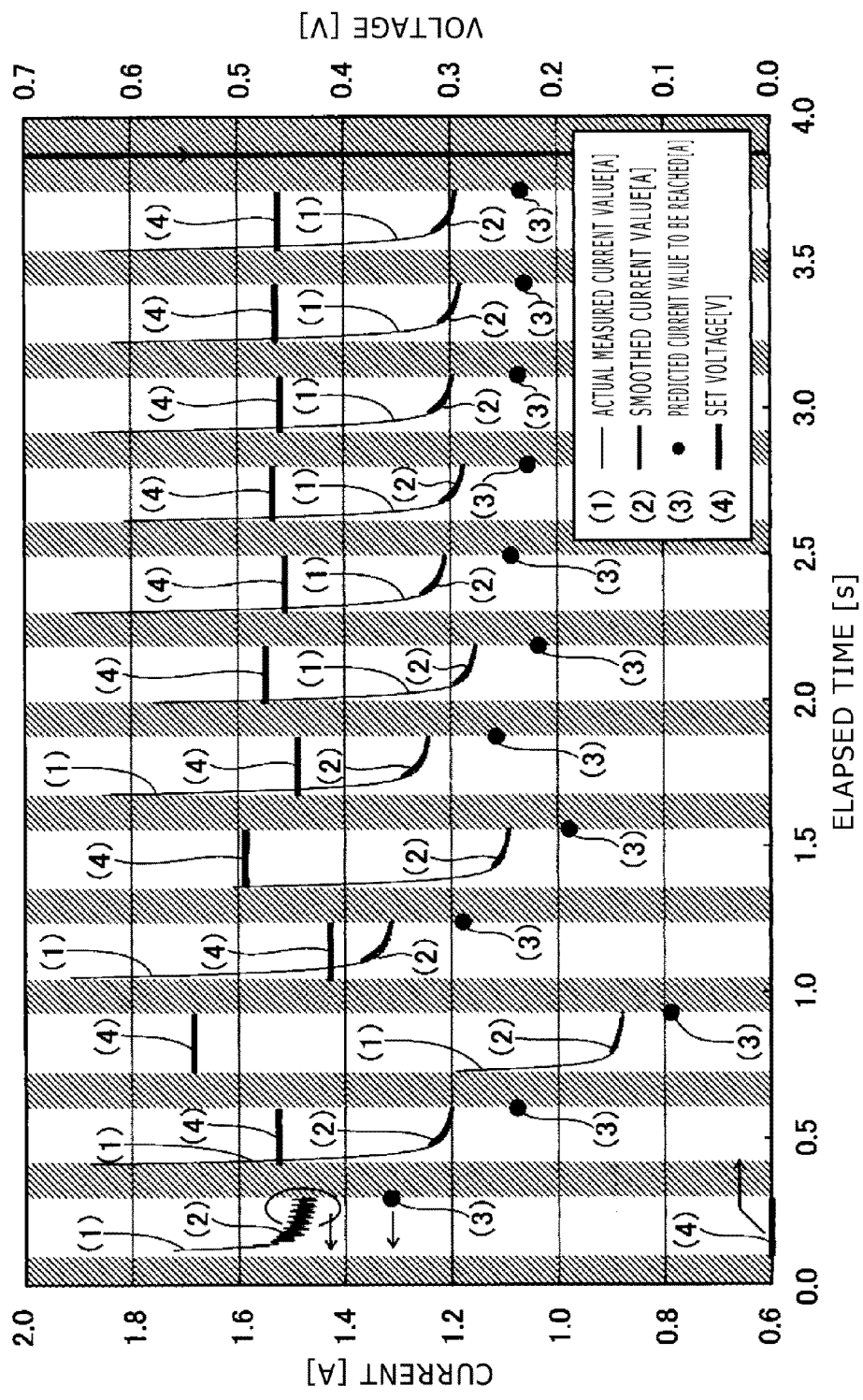
FIG. 15 is a schematic diagram showing a process of searching for a maximum power point in the dye-sensitized solar cell.

FIG. 15 is a schematic diagram showing a process of searching for an MPP in the dye-sensitized solar cell on the basis of the algorithm shown in FIG. 13.

Figure 16:
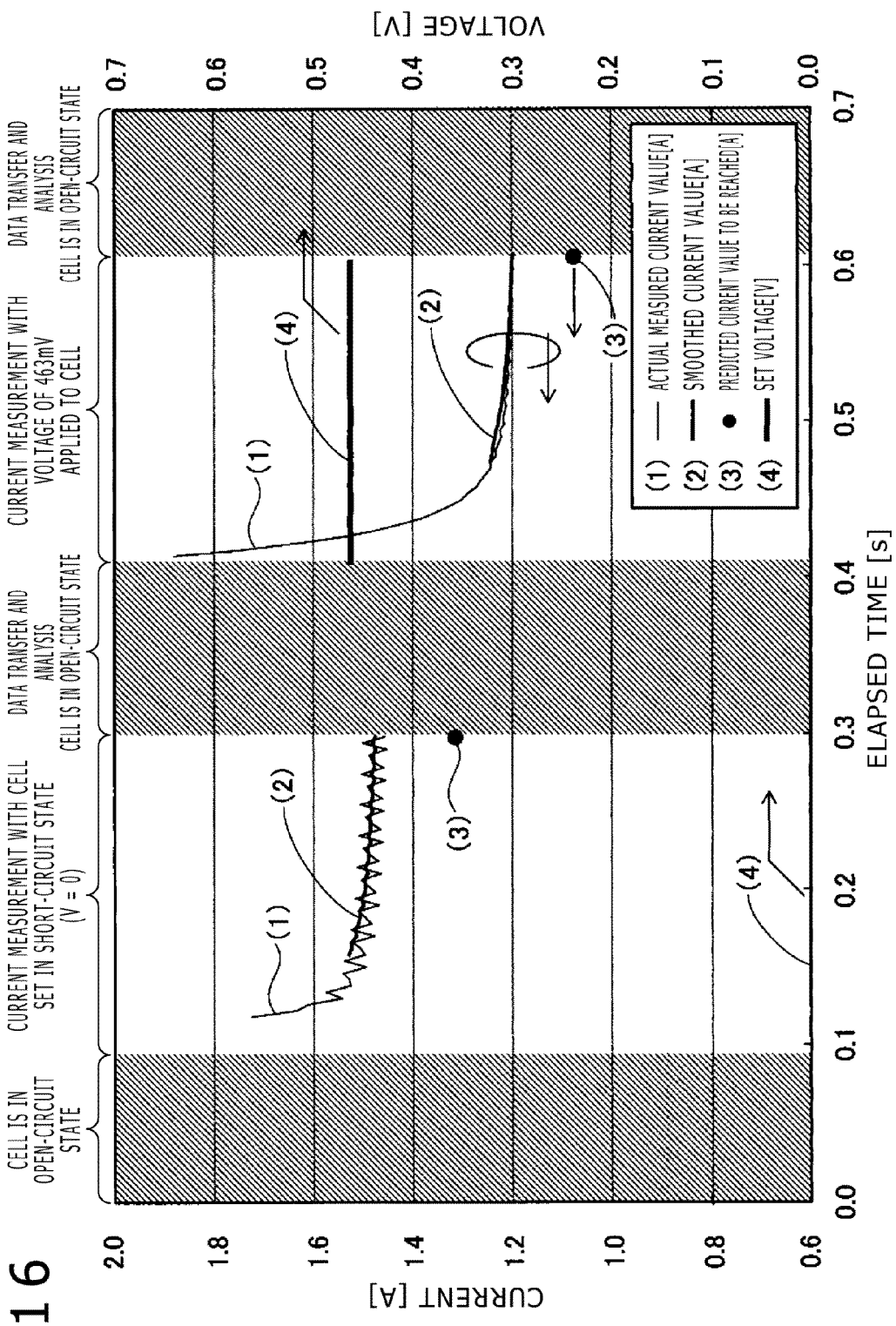
FIG. 16 is an enlarged view obtained by enlarging parts of a first and a second measurements in FIG. 15.

FIG. 16 is an enlarged view obtained by enlarging parts of a first and a second measurement in FIG. 15.

The process of searching for the MPP in the dye-sensitized solar cell will be described in detail with reference to FIG. 13, FIG. 15, and FIG. 16.

As shown in FIG. 16, in a first process, the cell is set in a short-circuit state (V=0), a short-circuit current $I_{sc}$ is measured a plurality of times at predetermined time intervals, and 50 current values $I_0$ to $I_{49}$ are obtained at measurement intervals of 4 ms. The measurement intervals and the number of pieces of data to be obtained are set at appropriate values as appropriate in consideration of the area of the dye-sensitized solar cell being measured, the kind of electrolytic solution, and the like (step S46).

Next, because an inrush current flows for a few ten milliseconds after the cell is short-circuited, the current values $I_{15}$ to $I_{49}$ are extracted as current values obtained after the passage of a few ten milliseconds from a start of the measurement. Further, these current values are subjected to an exponential moving average filter to remove noise. The exponential moving average filter substitutes a current value $I_n = I_{raw}$ into Equation (5) (step S47).

In this case, α is an arbitrary constant, and i is 15 to 49. An appropriate value is set as α in Equation (5) as appropriate in consideration of the area of the dye-sensitized solar cell being measured, the kind of electrolytic solution, and the like.

Next, last 30 current values ($I_{19}$ to $I_{49}$) are obtained, Equation (6) is set as a fitting function, and the search range of C in Equation (7) is set. From Equation (10) and Equation (11), the lower limit value $C_{min}$ and the upper limit value $C_{max}$ of the search range of C are set as follows (step S48):

$$C_{min} = rI_{49} - (r-1)I_{19} - r|I_{49} - I_{19}|$$

$$C_{max} = rI_{49} - (r-1)I_{19} - r|I_{49} - I_{19}|$$

The measurement of the current value is ended (step S50) when a predicted value $I_{rch1}$ of the value to be reached by the current is obtained (step S49). One measurement is ended in 200 milliseconds. At the same time as the end of the measurement, measurement data is transferred to a data logger or the like and analyzed. The process proceeds to a next measurement. The set value of the power generation voltage for the second and subsequent measurements is sequentially determined by the three-division search method using the golden ratio.

In the second process, a voltage V=463 mV is applied between the two terminals of the cell. Thereafter a predicted value $I_{rch2}$ of the value to be reached by the current is obtained as in the first process.

Then, as shown in FIG. 15, the set value of the power generation voltage is sequentially determined in a range of 0 V to the open-circuit voltage $V_{oc}$ by the three-division search method using the golden ratio. This is performed 12 times, and a predicted output value $P_{max}$ of a maximum output and a voltage value $V_{max}$ at the time of the predicted output value $P_{max}$ are each obtained. A total time taken for all of 12 times of obtainment of the predicted output value $P_{max}$ and the voltage value $V_{max}$ at the time of the predicted output value $P_{max}$ was about 3.9 seconds.

Figure 17:
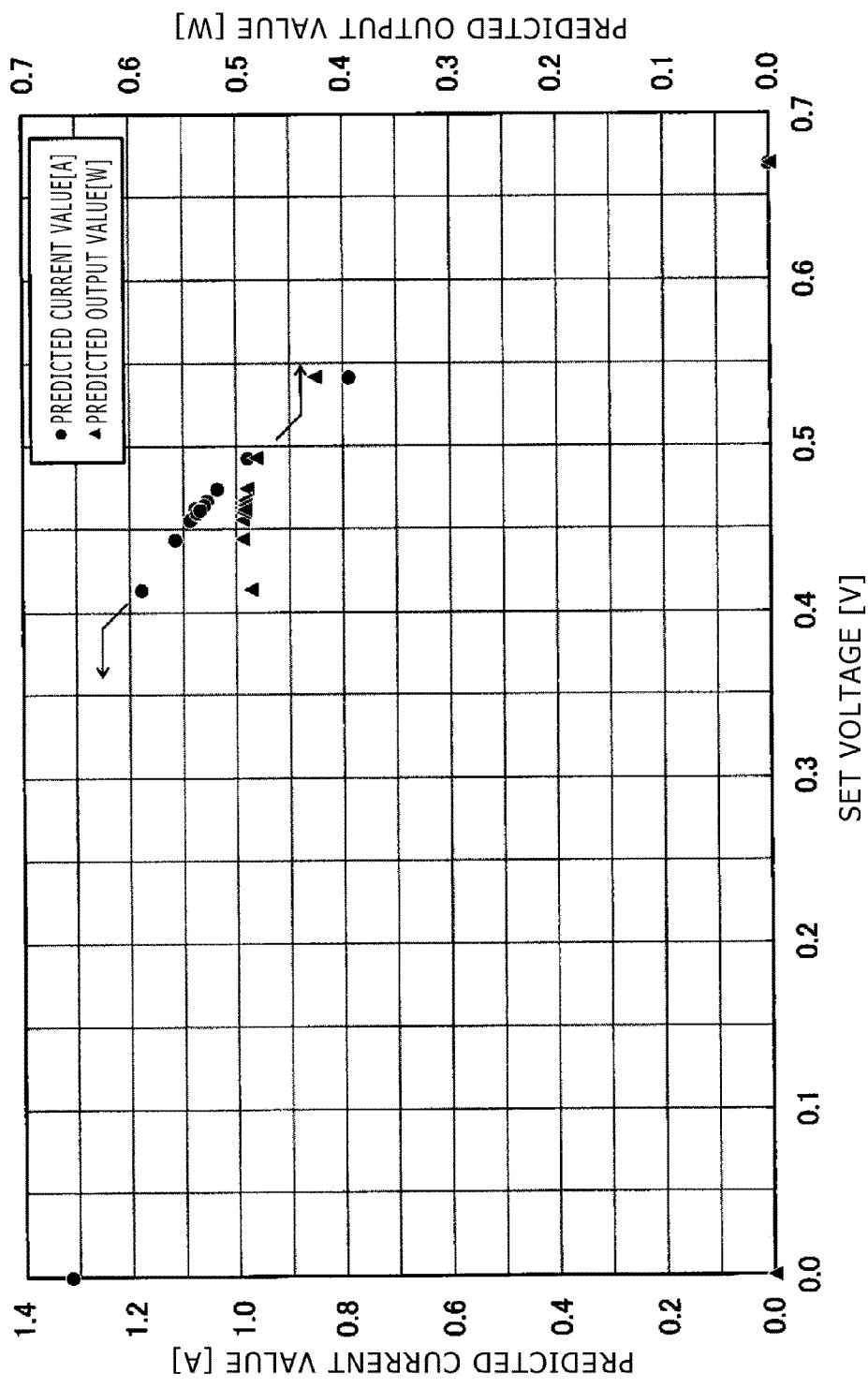
FIG. 17 is a schematic diagram showing an I-V output characteristic and a P-V output characteristic of the dye-sensitized solar cell which output characteristics are obtained by an algorithm in the third embodiment.

FIG. 17 is a schematic diagram showing an I-V output characteristic and a P-V output characteristic obtained in Example 3-1.

As shown in FIG. 17, the voltage $V_{max}$ that maximized the output was 462 mV, and the predicted output value $P_{max}$ at the time of the voltage $V_{max}$ was 495 mW.

As described above, in addition to similar advantages to those of the solar cell system according to the first and second embodiments, the solar cell system according to the third embodiment can quickly obtain a predicted current value with high accuracy by predicting the value to be reached by the current by fitting the current value of the power generation current having a transient response characteristic to the inverse function or the exponential function in the output predicting unit of the solar cell system, and setting this value as the predicted current value. In addition, not only the predicted current value but also the output characteristic of the solar cell can be obtained simultaneously when the predicted current value is obtained by the function fitting.

4. Fourth Embodiment

[Solar Cell System]

Figure 18:
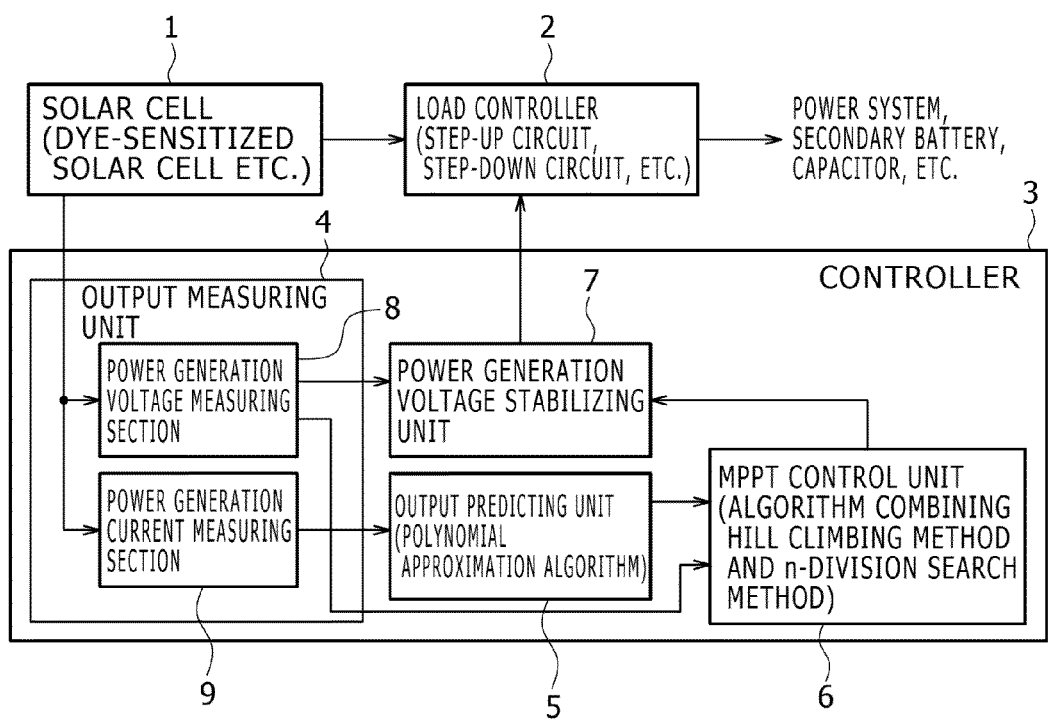
FIG. 18 is a block diagram showing a solar cell system according to a fourth embodiment.

FIG. 18 is a block diagram showing a solar cell system according to a fourth embodiment.

As shown in FIG. 18, the solar cell system 10 according to the fourth embodiment is a solar cell system having a configuration according to one of the first to third embodiments or a combination thereof, and makes an MPPT control unit 6 search for an MPP by a combination of the hill climbing method and the n-division search method and performs power generation control.

[Operation of Solar Cell System]

Figure 19:
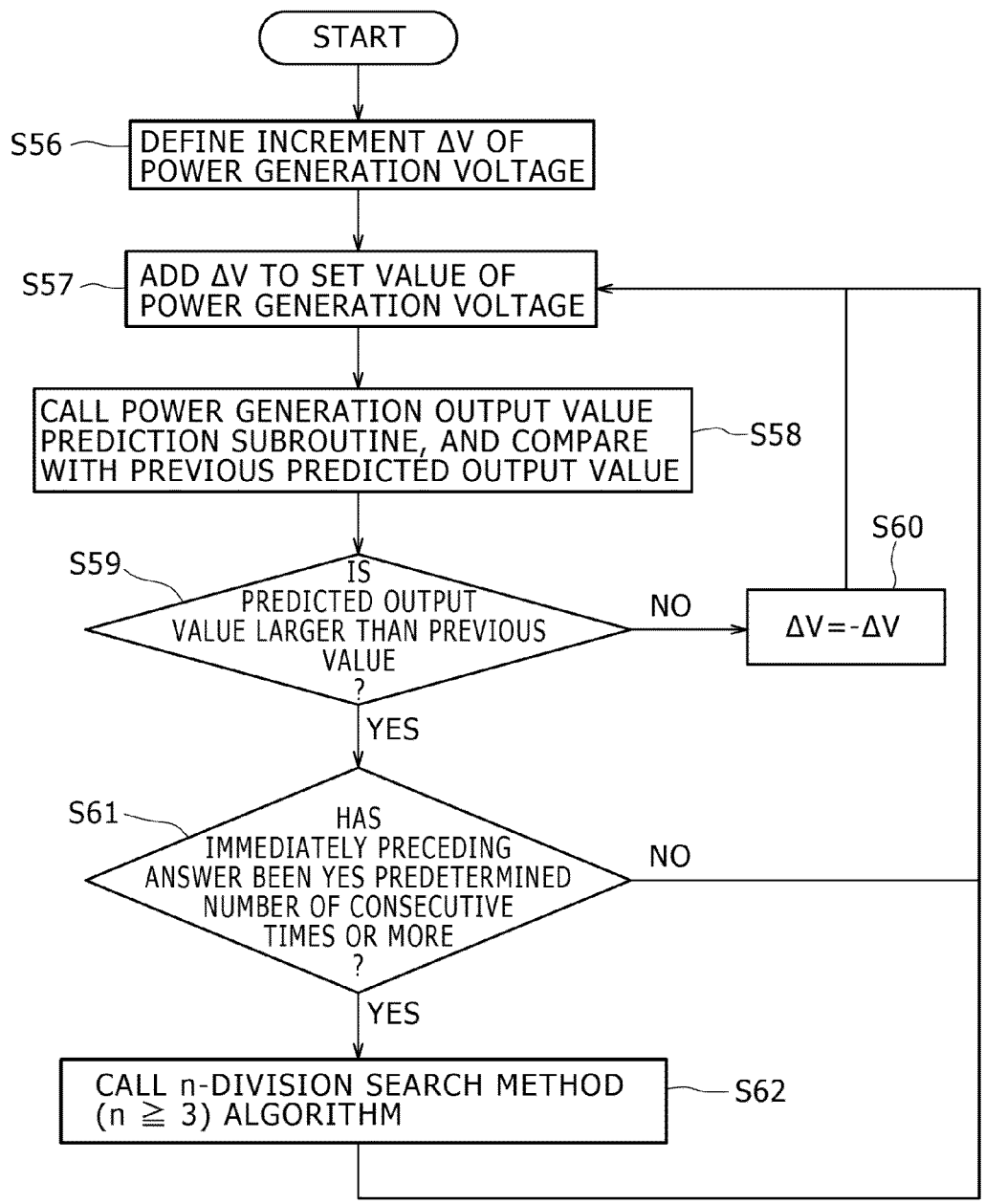
FIG. 19 is a flowchart of a process of searching for an MPP by a combination of a hill climbing method and an n-division search method and setting the value of power generation voltage.

FIG. 19 is a flowchart of a process of searching for an MPP by the combination of the hill climbing method and the n-division search method and setting the value of power generation voltage in the MPPT control unit 6. The n-division search method in this case is for example the four-division search method, the three-division search method using the golden ratio division, or the like. However, the n-division search method is not limited to these methods. The solar cell system 10 according to the fourth embodiment otherwise has a configuration according to one of the first to third embodiments or a combination thereof.

This algorithm will be described in the following with reference to FIG. 19.

First, an increment $\Delta V$ of the power generation voltage is defined (step S56).

Next, $\Delta V$ is added to the set value of the power generation voltage (step S57).

Next, an output predicting unit 5 is called, and a returned predicted output value is compared with a predicted output value in a previous loop (step S58).

Next, when the predicted output value is the same as the predicted output value in the previous loop in step S58, the process is ended. When the predicted output value is not the same as the predicted output value in the previous loop in step S58, the process proceeds to step S59.

When the predicted output value is larger than the predicted output value in the previous loop in step S59, the process proceeds to step S61. When the predicted output value is conversely smaller than the predicted output value in the previous loop in step S59, $\Delta V$ is changed to $-\Delta V$ (step S60), and the process returns to step S57 (reversal of direction).

When it is determined in step S61 that the predicted output value has been larger than the predicted output value in the previous loop a specified number of consecutive times or more in step S59, the process proceeds to step S62. When the predicted output value has not been larger than the predicted output value in the previous loop the specified number of consecutive times or more in step S59, the process returns to step S57.

In step S62, the algorithm for searching for an MPP by the n-division search method, for example the four-division search method, and determining the set value of the power generation voltage is called. After the set value of the power generation voltage is returned, the process returns to step S59.

As described above, in addition to similar advantages to those of the solar cell system according to the first to third embodiments, the solar cell system according to the fourth embodiment performs control based on the hill climbing method, searches for a state of highest efficiency by the hill climbing method, and performs n-division search operation that is triggered by having walked in the same direction n times (for example n=3) or more. Thus, a quick search is made by the n-division search method up to the vicinity of the MPP, and a precise search is made by the hill climbing method from the vicinity of the MPP to the MPP. It is thereby possible to obtain the MPP quickly and precisely, and provide a solar cell system that can follow changes in P-V output characteristic more quickly and precisely.

5. Fifth Embodiment

[Solar Cell System]

Figure 20:
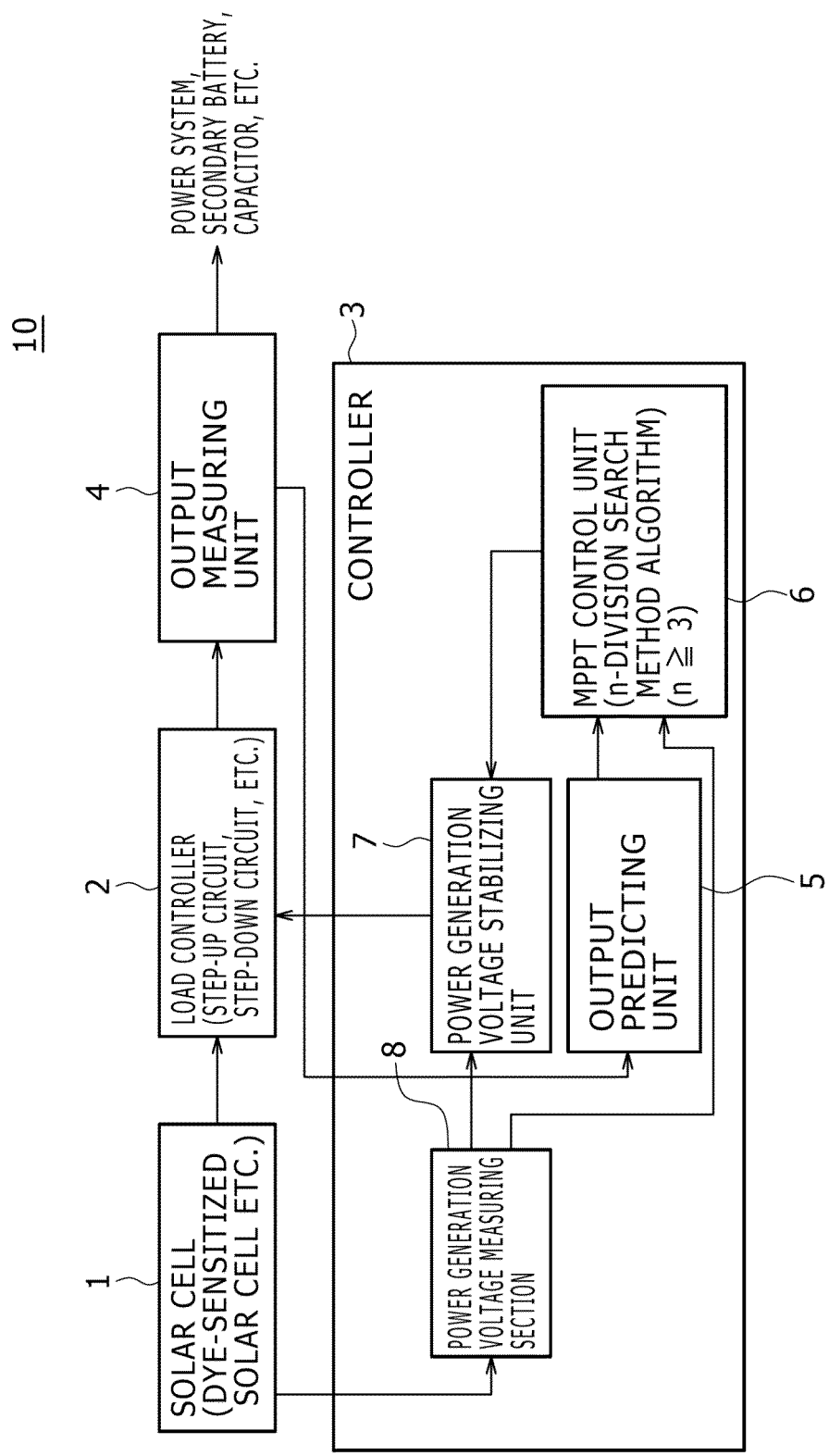
FIG. 20 is a block diagram showing a solar cell system according to a fifth embodiment.
Figure 21:
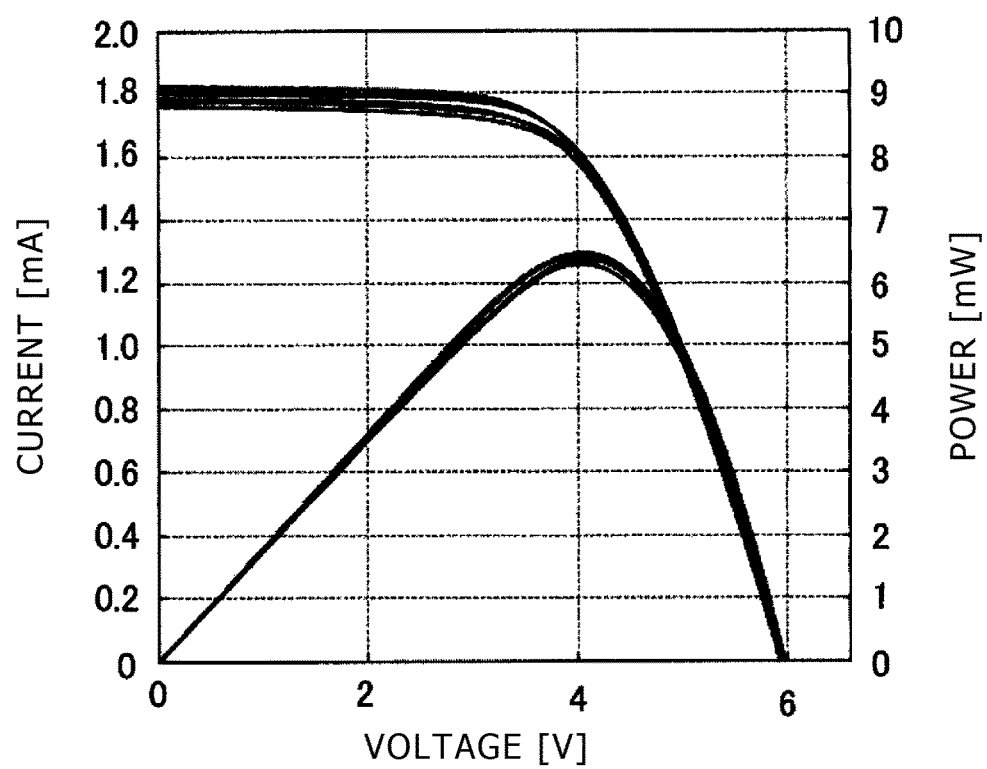
FIG. 21 is a schematic diagram showing an example of the I-V output characteristic and the power-voltage output characteristic (P-V output characteristic) of a solar cell under a constant-light source.

FIG. 20 is a block diagram showing a solar cell system according to a fifth embodiment.

As shown in FIG. 20, the solar cell system 10 according to the fifth embodiment has a shunt resistance connected in series in a stage subsequent to a load controller 2, and measures a voltage drop across the shunt resistance by an output measuring unit 4 as a current detecting device formed by combining an amplifying circuit with an AD converter in a case where a circuit whose voltage is relatively stable, such as a secondary battery, a power system, or the like, is connected in a stage subsequent to the load controller 2. The solar cell system 10 according to the fifth embodiment otherwise has a configuration according to one of the first to fourth embodiments or a combination thereof.

When the above measuring method is used, the measurement value of the measuring method can be regarded as the power generation output of the solar cell. A reason for this is that the following relation holds between the power generation current $I_{CELL}$ and the power generation voltage $V_{CELL}$ of the solar cell and energy conversion efficiency $\eta$ in the load controller 2 and a current $I_{OUT}$ and a voltage $V_{OUT}$ in the stage subsequent to the load controller 2.

$$\eta I_{CELL} V_{CELL} = I_{OUT} V_{OUT}$$

As described above, in addition to similar advantages to those of the solar cell system according to the first to fourth embodiments, the solar cell system according to the fifth embodiment has a shunt resistance connected in series in a stage subsequent to the load controller 2, and has the output measuring unit 4 that measures a voltage drop across the shunt resistance by a combination of an amplifying circuit and an AD converter in a case where a circuit whose voltage is relatively stable, such as a secondary battery, a power system, or the like, is connected in a stage subsequent to the load controller 2. The solar cell system 10 according to the fifth embodiment can therefore measure the power generation output of the solar cell simply. This eliminates a need to measure the power generation current of the solar cell itself, and thus eliminates a need to connect a shunt resistance in series with each of the low side and the high side of the solar cell. It is therefore possible to realize a solar cell system at low cost and with low power consumption.

Embodiments and examples have been described above concretely. However, the present disclosure is not limited to the foregoing embodiments and examples, but is susceptible of various modifications based on technical ideas of the present disclosure.

For example, numerical values, structures, constitutions, shapes, materials, and the like cited in the foregoing embodiments and examples are mere examples. Numerical values, structures, constitutions, shapes, materials, and the like different from those cited in the foregoing embodiments and examples may be used as required.

It is to be noted that the present technology can also adopt the following constitutions.

(1) A solar cell system including:

a solar cell;

a load controller configured to be connected to the solar cell, the load controller being capable of controlling a load applied to the solar cell;

an output measuring unit configured to measure a power generation output of the solar cell; and an output predicting unit configured to predict a value to be reached by the output on a basis of transient response of the output measured by the output measuring unit, wherein the solar cell system has a function of controlling the load controller so as to maximize the value to be reached.

(2) The solar cell system according to (1), further including a power generation control system, wherein the power generation control system performs a process of dividing a load range from a minimum load condition to a maximum load condition of the load controller into n parts (n≥3), performing output prediction under each of n load conditions in the output predicting unit, and outputting the load condition providing a largest output value from n predicted output values obtained, the power generation control system performs a process of further dividing a load range including the output load condition into n parts, performing output prediction under each of n load conditions, and outputting the load condition providing a largest output value from n predicted output values obtained, and the power generation control system detects and outputs a load condition maximizing the output value by repeating the process while gradually narrowing a width of the load range including the output load condition.

(3) The solar cell system according to (1) or (2), wherein the load conditions are obtained by dividing the load range into three parts in a following ratio:

$$1 : \frac{\sqrt{5}-1}{2} : 1$$

(4) The solar cell system according to any one of (1) to (3), wherein the output predicting unit outputs a predicted output value obtained by performing a process by only a combination of four arithmetic operations using at least four actual measured values measured by the output measuring unit and at least three constants.

(5) The solar cell system according to any one of (1) to (4), wherein the output predicting unit outputs a predicted output value $P_{estimate, n}$ obtained from m (m is a natural number of four or more) output values $P_{n-m}, P_{n-m+1}, P_{n-m+2}, \ldots, P_{n-1}, P_n$ measured by the output measuring unit at fixed time intervals and m arbitrary constants $A_1, A_2, A_3, A_4, \ldots, A_{m-1}, A_m$ by a following equation:

$$P_{estimate,n} = P_{n-3} + A_1(P_{n-2}-P_{n-3}) + A_2(P_{n-1}-P_{n-2}) + A_3(P_n-P_{n-1})$$

(6) The solar cell system according to any one of (1) to (5), wherein the output predicting unit performs the output of the predicted output value $P_{estimate, n}$ at least twice, and repeats the output until an absolute value $|P_{estimate, n} - P_{estimate, n-1}|$ of a difference between two output consecutive predicted output values $P_{estimate, n}$ becomes a predetermined value or less.

(7) The solar cell system according to any one of (1) to (6), wherein measurement of the load condition of the load controller is not performed under a load condition of a current value being zero and/or a load condition of a voltage value being zero.

(8) The solar cell system according to any one of (1) to (7), wherein the load controller is a step-up circuit or a step-down circuit, and is feedback-controlled so that power generation voltage of the solar cell is constant, and the output measuring unit is a current detecting device disposed in a stage subsequent to the load controller, and sets a current value detected by the current detecting device as an output value.

(9) The solar cell system according to any one of (1) to (8), wherein the solar cell is a dye-sensitized solar cell.

(10) The solar cell system according to (2) or (3), wherein the output predicting unit applies a voltage to the solar cell, the output predicting unit smoothes n current values measured consecutively by a power generation current measuring section after passage of a certain time from application of the voltage, and the output predicting unit obtains a predicted current value by fitting the n smoothed currents to a following inverse function:

$$I(t) = \frac{A}{B+t} + C$$

and outputs a value obtained by multiplying the predicted current value by a value of the voltage as a predicted output value.

(11) The solar cell system according to (10), wherein the predicted current value is obtained by fitting the n smoothed currents to a following exponential function:

$$I(t) = A\exp(Bt) + C$$

and a value obtained by multiplying the predicted current value by the value of the voltage is output as the predicted output value.

(12) The solar cell system according to (1), further including a power generation control system, wherein the power generation control system changes a set value of power generation voltage at certain time intervals by the load controller, and measures whether an output value has been raised or dropped by the change by the output measuring unit a plurality of times, when a value of change in the output value has been positive or negative a specified number of consecutive times or more, the power generation control system performs a process of dividing a load range from a minimum load condition to a maximum load condition of the load controller into n parts (n≥3), performing output prediction under each of n load conditions in the output predicting unit, and outputting the load condition providing a largest output value from n predicted output values obtained, the power generation control system performs a process of further dividing a load range including the output load condition into n parts, performing output prediction under each of n load conditions, and outputting the load condition providing a largest output value from n predicted output values obtained, and the power generation control system detects and outputs a load condition maximizing the output value by repeating the process while gradually narrowing a width of the load range including the output load condition.

(13) The solar cell system according to (12),
wherein the load conditions are obtained by dividing the load range into three parts in a following ratio:

$$1 : \frac{\sqrt{5}-1}{2} : 1$$

(14) The solar cell system according to (12) or (13),
wherein the output predicting unit outputs a predicted output value obtained by performing a process by only a combination of four arithmetic operations using at least four actual measured values measured by the output measuring unit and at least three constants.

(15) The solar cell system according to any one of (12) to (14),
wherein the output predicting unit outputs a predicted output value $P_{estimate, n}$ obtained from m (m is a natural number of four or more) output values $P_{n-m}, P_{n-m+1}, P_{n-m+2}, \ldots, P_{n-1}, P_n$ measured by the output measuring unit at fixed time intervals and m arbitrary constants $A_1, A_2, \ldots, A_m$ by a following equation:

$$P_{estimate,n} = P_{n-m} + A_1(P_{n-m+1} - P_{n-m}) + A_2(P_{n-m+2} - P_{n-m+1}) + \ldots + A_m(P_n - P_{n-1})$$

(16) The solar cell system according to any one of (12) to (15),
wherein the output predicting unit performs the output of the predicted output value $P_{estimate, n}$ at least twice, and repeats the output until an absolute value $|P_{estimate, n} - P_{estimate, n-1}|$ of a difference between two output consecutive predicted output values $P_{estimate, n}$ becomes a predetermined value or less.

(17) The solar cell system according to (12) or (13),
wherein the output predicting unit applies a voltage to the solar cell,
the output predicting unit smoothes n current values measured consecutively by a power generation current measuring section after passage of a certain time from application of the voltage, and
the output predicting unit obtains a predicted current value by fitting the n smoothed currents to a following inverse function:

$$I(t) = \frac{A}{B+t} + C$$

and outputs a value obtained by multiplying the predicted current value by a value of the voltage as a predicted output value.

(18) An electronic device including:
a solar cell system,
wherein the solar cell system includes
a solar cell,
a load controller configured to be connected to the solar cell, the load controller being capable of controlling a load applied to the solar cell,
an output measuring unit configured to measure a power generation output of the solar cell, and
an output predicting unit configured to predict a value to be reached by the output on a basis of transient response of the output measured by the output measuring unit, and
the solar cell system has a function of controlling the load controller so as to maximize the value to be reached.

(19) A structure including:
a solar cell system,
wherein the solar cell system includes
a solar cell,
a load controller configured to be connected to the solar cell, the load controller being capable of controlling a load applied to the solar cell,
an output measuring unit configured to measure a power generation output of the solar cell, and
an output predicting unit configured to predict a value to be reached by the output on a basis of transient response of the output measured by the output measuring unit, and
the solar cell system has a function of controlling the load controller so as to maximize the value to be reached.

(20) The structure according to (19),
wherein a solar cell is sandwiched between two transparent plates.

The present disclosure contains subject matter related to that disclosed in Japanese Priority Patent Application JP 2011-240248 filed in the Japan Patent Office on Nov. 1, 2011, the entire content of which is hereby incorporated by reference.

What is claimed is:

1. A solar cell system comprising: a solar cell; a load controller configured to be connected to the solar cell, the load controller being capable of controlling a load applied to the solar cell; an output measuring unit configured to measure a power generation output of the solar cell; an output predicting unit configured to predict a value to be reached by the output on a basis of transient response of the output measured by the output measuring unit, wherein the solar cell system has a function of controlling the load controller so as to maximize the value to be reached; and a power generation control system, wherein the power generation control system performs a process of dividing a load range from a minimum load condition to a maximum load condition of the load controller into n parts (n≥3), performing output prediction under each of n load conditions in the output predicting unit, and outputting the load condition providing a largest output value from n predicted output values obtained, the power generation control system performs a process of further dividing a load range including the output load condition into n parts, performing output prediction under each of n load conditions, and outputting the load condition providing a largest output value from n predicted output values obtained, and the power generation control system detects and outputs a load condition maximizing the output value by repeating the process while gradually narrowing a width of the load range including the output load condition.

2. The solar cell system according to claim 1,
wherein the load conditions are obtained by dividing the load range into three parts in a following ratio:

$$1 : \frac{\sqrt{5}-1}{2} : 1.$$

3. The solar cell system according to claim 2,
wherein the output predicting unit outputs a predicted output value obtained by performing a process by only a combination of four arithmetic operations using at least four actual measured values measured by the output measuring unit and at least three constants.

4. The solar cell system according to claim 3,
wherein the output predicting unit outputs a predicted output value $P_{estimate, n}$ obtained from m (m is a natural number of four or more) output values $P_{n-m}$, $P_{n-m+1}$, $P_{n-m+2}, \ldots, P_{n-1}, P_n$ measured by the output measuring unit at fixed time intervals and m arbitrary constants $A_1$, $A_2, A_3, A_4, \ldots, A_{m-1}, A_m$ by a following equation:

$P_{estimate,n} = P_{n-3} + A_1(P_{n-2} - P_{n-3}) + A_2(P_{n-1} - P_{n-2}) + A_3(P_n - P_{n-1})$.

5. The solar cell system according to claim 4,
wherein the output predicting unit performs the output of the predicted output value $P_{estimate, n}$ at least twice, and repeats the output until an absolute value $|P_{estimate, n} - P_{estimate, n-1}|$ of a difference between two output consecutive predicted output values $P_{estimate, n}$ becomes a predetermined value or less.

6. The solar cell system according to claim 5,
wherein measurement of the load condition of the load controller is not performed under a load condition of a current value being zero and/or a load condition of a voltage value being zero.

7. The solar cell system according to claim 6,
wherein the load controller is a step-up circuit or a step-down circuit, and is feedback-controlled so that power generation voltage of the solar cell is constant, and
the output measuring unit is a current detecting device disposed in a stage subsequent to the load controller, and sets a current value detected by the current detecting device as an output value.

8. The solar cell system according to claim 7,
wherein the solar cell is a dye-sensitized solar cell.

9. The solar cell system according to claim 1,
wherein the output predicting unit applies a voltage to the solar cell,
the output predicting unit smoothes n current values measured consecutively by a power generation current measuring section after passage of a certain time from application of the voltage, and
the output predicting unit obtains a predicted current value by fitting the n smoothed currents to a following inverse function:

$$I(t) = \frac{A}{B+t} + C$$

and outputs a value obtained by multiplying the predicted current value by a value of the voltage as a predicted output value.

10. The solar cell system according to claim 9,
wherein the predicted current value is obtained by fitting the n smoothed currents to a following exponential function:

$I(t) = A\exp(Bt) + C$ and a value obtained by multiplying the predicted current value by the value of the voltage is output as the predicted output value.

11. The solar cell system according to claim 1, wherein the power generation control system changes a set value of power generation voltage at certain time intervals by the load controller, and measures whether an output value has been raised or dropped by the change by the output measuring unit a plurality of times, when a value of change in the output value has been positive or negative a specified number of consecutive times or more, the power generation control system performs the process of dividing a load range from a minimum load condition to a maximum load condition of the load controller into n parts (n≥3), performing output prediction under each of n load conditions in the output predicting unit, and outputting the load condition providing a largest output value from n predicted output values obtained.

12. The solar cell system according to claim 1,
wherein the load conditions are obtained by dividing the load range into three parts in a following ratio:

$$1 : \frac{\sqrt{5}-1}{2} : 1.$$

13. The solar cell system according to claim 12,
wherein the output predicting unit applies a voltage to the solar cell,
the output predicting unit smoothes n current values measured consecutively by a power generation current measuring section after passage of a certain time from application of the voltage, and
the output predicting unit obtains a predicted current value by fitting the n smoothed currents to a following inverse function:

$$I(t) = \frac{A}{B+t} + C$$

and outputs a value obtained by multiplying the predicted current value by a value of the voltage as a predicted output value.

14. The solar cell system according to claim 12,
wherein the output predicting unit outputs a predicted output value obtained by performing a process by only a combination of four arithmetic operations using at least four actual measured values measured by the output measuring unit and at least three constants.

15. The solar cell system according to claim 14,
wherein the output predicting unit outputs a predicted output value $P_{estimate, n}$ obtained from m (m is a natural number of four or more) output values $P_{n-m}$, $P_{n-m+1}$, $P_{n-m+2}, \ldots, P_{n-1}, P_n$ measured by the output measuring unit at fixed time intervals and m arbitrary constants $A_1$, $A_2, \ldots, A_m$ by a following equation:

$P_{estimate,n} = P_{n-m} + A_1(P_{n-m+1} - P_{n-m}) + A_2(P_{n-m+2} - P_{n-m+1}) + \ldots + A_m(P_n - P_{n-1})$.

16. The solar cell system according to claim 15,
wherein the output predicting unit performs the output of the predicted output value $P_{estimate, n}$ at least twice, and repeats the output until an absolute value $|P_{estimate, n} - P_{estimate, n-1}|$ of a difference between two output consecutive predicted output values $P_{estimate, n}$ becomes a predetermined value or less.

17. An electronic device comprising: a solar cell system, wherein the solar cell system includes a solar cell, a load controller configured to be connected to the solar cell, the load controller being capable of controlling a load applied to the solar cell, an output measuring unit configured to measure a power generation output of the solar cell, an output predicting unit configured to predict a value to be reached by the output on a basis of transient response of the output measured by the output measuring unit, and the solar cell system has a function of controlling the load controller so as to maximize the value to be reached; and a power generation control system, wherein the power generation control system performs a process of dividing a load range from a minimum load condition to a maximum load condition of the load controller into n parts (n≥3), performing output prediction under each of n load conditions in the output predicting unit, and outputting the load condition providing a largest output value from n predicted output values obtained, the power generation control system performs a process of further dividing a load range including the output load condition into n parts, performing output prediction under each of n load conditions, and outputting the load condition providing a largest output value from n predicted output values obtained, and the power generation control system detects and outputs a load condition maximizing the output value by repeating the process while gradually narrowing a width of the load range including the output load condition.

18. A structure comprising: a solar cell system, wherein the solar cell system includes a solar cell, a load controller configured to be connected to the solar cell, the load controller being capable of controlling a load applied to the solar cell, an output measuring unit configured to measure a power generation output of the solar cell, an output predicting unit configured to predict a value to be reached by the output on a basis of transient response of the output measured by the output measuring unit, and the solar cell system has a function of controlling the load controller so as to maximize the value to be reached; and a power generation control system, wherein the power generation control system performs a process of dividing a load range from a minimum load condition to a maximum load condition of the load controller into n parts (n≥3), performing output prediction under each of n load conditions in the output predicting unit, and outputting the load condition providing a largest output value from n predicted output values obtained, the power generation control system performs a process of further dividing a load range including the output load condition into n parts, performing output prediction under each of n load conditions, and outputting the load condition providing a largest output value from n predicted output values obtained, and the power generation control system detects and outputs a load condition maximizing the output value by repeating the process while gradually narrowing a width of the load range including the output load condition.

19. The structure according to claim 18,
wherein a solar cell is sandwiched between two transparent plates.

* * * * *